US012490450B2

(12) United States Patent
Hsiao et al.

(10) Patent No.: US 12,490,450 B2
(45) Date of Patent: Dec. 2, 2025

(54) MANUFACTURING METHOD OF A SEMICONDUCTOR DEVICE WITH JUNCTION FIELD EFFECT TRANSISTOR

(71) Applicants: HON HAI PRECISION INDUSTRY CO., LTD., New Taipei (TW); Hon Young Semiconductor Corporation, Hsinchu (TW)

(72) Inventors: Yi-Kai Hsiao, New Taipei (TW); Kuang-Hao Chiang, Hsinchu (TW); Hao-Chung Kuo, New Taipei (TW)

(73) Assignees: HAI PRECISION INDUSTRY CO., LTD., New Taipei (TW); Hon Young Semiconductor Corporation, Hsinchu (TW)

( * ) Notice: Subject to any disclaimer, the term of this patent is extended or adjusted under 35 U.S.C. 154(b) by 377 days.

(21) Appl. No.: 18/360,843

(22) Filed: Jul. 28, 2023

(65) Prior Publication Data

US 2024/0038874 A1    Feb. 1, 2024

(30) Foreign Application Priority Data

Jul. 29, 2022    (TW) .................................. 111128674

(51) Int. Cl.
*H10D 30/01*        (2025.01)
*H01L 21/266*      (2006.01)
(Continued)

(52) U.S. Cl.
CPC ....... *H10D 30/0291* (2025.01); *H01L 21/266* (2013.01); *H10D 30/051* (2025.01);
(Continued)

(58) Field of Classification Search
CPC . H01L 21/266; H01L 21/2652; H01L 21/306; H01L 21/31105; H01L 21/31144;
(Continued)

(56) References Cited

U.S. PATENT DOCUMENTS 7,202,528 B2 *   4/2007   Sankin ................... H10D 30/83
                                                                257/256
7,221,010 B2 *   5/2007   Ryu ....................... H10D 84/035
                                                                257/256
(Continued)

FOREIGN PATENT DOCUMENTS

CN      107331617 A    11/2017
TW         1536575 B     6/2016
TW      201924060 A     6/2019

*Primary Examiner* — Maliheh Malek
(74) *Attorney, Agent, or Firm* — CKC & Partners Co., LLC

(57) ABSTRACT

A manufacturing method of a semiconductor device includes the following steps. A base region is formed in a substrate. A protective layer is formed on the substrate and covers the base region. First and second sacrificial layers are formed on the substrate and cover the protective layer. A source region, a well region, and a junction field effect transistor (JFET) region are formed in the substrate. When the source region, the well region, and the JFET region are formed in sequence, the source region and the well region are formed by the first sacrificial layer, and the JFET region is formed by the second sacrificial layer. When the JFET region, the well region, and the source region are formed in sequence, the JFET region is formed by the first sacrificial layer, and the well region and the source region are formed by the second sacrificial layer.

20 Claims, 24 Drawing Sheets

(51) Int. Cl.
   *H10D 30/66* (2025.01)
   *H10D 62/17* (2025.01)
   *H10D 84/87* (2025.01)
   *H01L 21/265* (2006.01)
   *H10D 62/832* (2025.01)

(52) U.S. Cl.
   CPC ........... *H10D 30/66* (2025.01); *H10D 62/299* (2025.01); *H10D 84/87* (2025.01); *H01L 21/2652* (2013.01); *H10D 62/8325* (2025.01)

(58) Field of Classification Search
   CPC ........ H01L 21/02378; H01L 21/26506; H10D 62/299; H10D 30/662; H10D 62/8325; H10D 62/157; H10D 62/124; H10D 30/01; H10D 62/343; H10D 30/051–0516; H10D 30/832; H10D 84/87; H10D 62/328; H10D 30/0512; H10D 30/83; H10D 30/831; H10D 84/035; H10D 30/0291–0297; H10D 30/66–669; H10D 30/63; H10D 84/016; H10D 84/0195; H10D 30/6728; H10F 39/196; H10B 63/34
   See application file for complete search history.

(56) References Cited

U.S. PATENT DOCUMENTS

| | | | | |
|---|---|---|---|---|
| 7,736,961 B2* | 6/2010 | Merchant | ............ | H10D 30/603 |
| | | | | 257/E21.403 |
| 9,070,714 B1* | 6/2015 | Alberhasky | .......... | H10D 62/157 |
| 9,530,844 B2* | 12/2016 | Zhang | ................ | H10D 30/0291 |
| 9,768,259 B2* | 9/2017 | Suvorov | ................ | H10D 8/051 |
| 10,374,075 B2* | 8/2019 | Tominaga | .............. | H10D 30/66 |
| 10,504,995 B1* | 12/2019 | Domeij | ................ | H10D 62/157 |
| 10,651,280 B2* | 5/2020 | Ota | ................ | H10D 62/153 |
| 10,749,002 B2* | 8/2020 | Domeij | ................ | H10D 62/157 |
| 11,139,394 B2* | 10/2021 | Konstantinov | ........ | H10D 30/66 |
| 11,476,369 B2* | 10/2022 | Konstantinov | ...... | H10D 62/157 |
| 11,631,762 B1* | 4/2023 | Potera | ................ | H10D 62/8325 |
| | | | | 257/77 |
| 11,682,722 B2* | 6/2023 | Pala | ..................... | H10D 62/157 |
| | | | | 257/77 |
| 11,830,943 B2* | 11/2023 | Sdrulla | .............. | H10D 30/0297 |
| 11,894,454 B2* | 2/2024 | Konstantinov | ........ | H10D 62/83 |
| 2004/0079989 A1* | 4/2004 | Kaneko | ................ | H10D 62/822 |
| | | | | 438/105 |
| 2006/0113593 A1* | 6/2006 | Sankin | ..................... | H10D 8/60 |
| | | | | 257/E29.313 |
| 2008/0296771 A1* | 12/2008 | Das | ..................... | H10D 62/393 |
| | | | | 257/758 |
| 2010/0200931 A1* | 8/2010 | Matocha | .............. | H10D 62/393 |
| | | | | 257/E21.409 |
| 2013/0082321 A1* | 4/2013 | Sobti | ..................... | H10D 62/157 |
| | | | | 257/329 |
| 2014/0210008 A1* | 7/2014 | Oritsuki | ............. | H10D 30/0291 |
| | | | | 438/237 |
| 2015/0028350 A1* | 1/2015 | Suvorov | .................. | H10D 8/60 |
| | | | | 257/77 |
| 2015/0097226 A1* | 4/2015 | Lichtenwalner | ..... | H10D 64/685 |
| | | | | 257/329 |
| 2015/0287817 A1* | 10/2015 | Kubota | ................ | H10D 62/393 |
| | | | | 257/77 |
| 2018/0069134 A1* | 3/2018 | Chu | ..................... | H10D 30/615 |
| 2018/0175188 A1* | 6/2018 | Banerjee | ............ | H10D 64/519 |
| 2018/0323299 A1* | 11/2018 | Tominaga | ............ | H10D 30/662 |
| 2020/0083331 A1* | 3/2020 | Domeij | ................ | H01L 21/308 |
| 2020/0259012 A1* | 8/2020 | Pala | ..................... | H10D 30/662 |
| 2021/0399128 A1* | 12/2021 | Lichtenwalner | ..... | H10D 62/393 |
| 2022/0093784 A1* | 3/2022 | Pala | ..................... | H10D 62/8325 |
| 2022/0238674 A1* | 7/2022 | Zhang | ................ | H10D 64/021 |
| 2022/0336219 A1* | 10/2022 | Miwa | ................ | H10D 30/0297 |
| 2023/0274937 A1* | 8/2023 | Uppili | .................... | H10D 62/393 |
| | | | | 257/77 |
| 2024/0038874 A1* | 2/2024 | Hsiao | .................... | H10D 62/157 |
| 2024/0097019 A1* | 3/2024 | Hsiao | ..................... | H10D 30/66 |
| 2024/0379844 A1* | 11/2024 | Hung | ................ | H10D 62/8325 |

* cited by examiner

MANUFACTURING METHOD OF A SEMICONDUCTOR DEVICE WITH JUNCTION FIELD EFFECT TRANSISTOR

CROSS-REFERENCE TO RELATED APPLICATION

This application claims priority to Taiwan Application Serial Number 111128674, filed Jul. 29, 2022, which is herein incorporated by reference.

BACKGROUND

Field of Disclosure

The present disclosure relates to a manufacturing method of a semiconductor device.

Description of Related Art

Silicon carbide power elements (e.g., transistors) have the characteristics of high blocking voltage, low on-resistance, and high thermal conductivity. Therefore, increased attention has been paid to silicon carbide power transistors. Among them, the impedance of the silicon carbide power transistor can be composed of the impedance of different components in the transistor, such as the impedance of contacts, channels, gates, epitaxial layers, and substrates. Among them, the impedance of the channel accounts for most of the impedance in silicon carbide power transistors.

SUMMARY

According to some embodiments of the present disclosure, a manufacturing method of a semiconductor device includes: forming a base region in a substrate; forming a first sacrificial layer on the substrate, in which the first sacrificial layer covers the base region; performing a photolithography process and a first etching process to pattern the first sacrificial layer, thereby forming a first distance between a vertical projection of an outer sidewall of the first sacrificial layer on the substrate and an inner side of the base region; forming a source region in the substrate by using the first sacrificial layer as a mask, in which the source region is adjacent to the base region; performing a second etching process to etch back the first sacrificial layer, thereby forming a second distance between the vertical projection of the outer sidewall of the first sacrificial layer on the substrate and an inner side of the source region; forming a well region in the substrate by using the first sacrificial layer as a mask, in which the well region is adjacent to the source region, and the well region is in contact with a bottom portion of the base region and a bottom portion of the source region; forming a second sacrificial layer on the substrate, in which the second sacrificial layer covers the base region, the source region, and the well region; performing a third etching process to remove the first sacrificial layer; forming a junction field effect transistor region in the substrate by using the second sacrificial layer as a mask; and removing the second sacrificial layer.

According to some embodiments of the present disclosure, a manufacturing method of a semiconductor device includes forming a base region in a substrate; forming a first sacrificial layer on the substrate, in which the first sacrificial layer covers the base region; performing a photolithography process and a first etching process to pattern the first sacrificial layer, thereby forming a first distance between a vertical projection of an inner sidewall of the first sacrificial layer on the substrate and an inner side of the base region; forming a junction field effect transistor region in the substrate by using the first sacrificial layer as a mask; forming a second sacrificial layer on the substrate, in which the second sacrificial layer covers the junction field effect transistor region; performing a second etching process to remove the first sacrificial layer; forming a well region in the substrate by using the second sacrificial layer as a mask, in which the well region is adjacent to the base region, and the well region is in contact with a bottom portion of the base region; expanding the second sacrificial layer, thereby forming a second distance between a vertical projection of an outer sidewall of the second sacrificial layer on the substrate and an outer side of the junction field effect transistor region; forming a source region in the substrate by using the second sacrificial layer as a mask, in which the well region is adjacent to the source region, and the well region is in contact with the bottom portion of the base region and a bottom portion of the source region; and removing the second sacrificial layer.

According to some embodiments of the present disclosure, a manufacturing method of a semiconductor device includes: forming base region in a substrate; forming a protective layer on the substrate, in which the protective layer covers the base region; forming a first sacrificial layer and a second sacrificial layer on the substrate, in which the first sacrificial layer and the second sacrificial layer covers the protective layer; forming a source region, a well region, and a junction field effect transistor in the substrate, in which: the source region, the well region, and the junction field effect transistor region are formed in sequence, the source region and the well region are formed by the first sacrificial layer that is patterned, and the junction field effect transistor region is formed by the second sacrificial layer; or the junction field effect transistor region, the well region, and the source region are formed in sequence, the junction field effect transistor region is formed by the first sacrificial layer that is patterned, and the well region and the source region are formed by the second sacrificial layer.

In some embodiments of the present disclosure, after removing the first sacrificial layer and the second sacrificial layer, an annealing process is performed on the base region, the source region, the well region, and the junction field effect transistor region.

According to the aforementioned embodiments of the present disclosure, the positions of the three ion-doped regions can be precisely defined through only a single photolithography process combined with the time control of the wet etching process and the replacement of the sacrificial layers. In this way, not only the precise channel length can be defined to reduce the impedance of the semiconductor device, but also the cost of the photomask can be saved, thereby reducing the cost.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
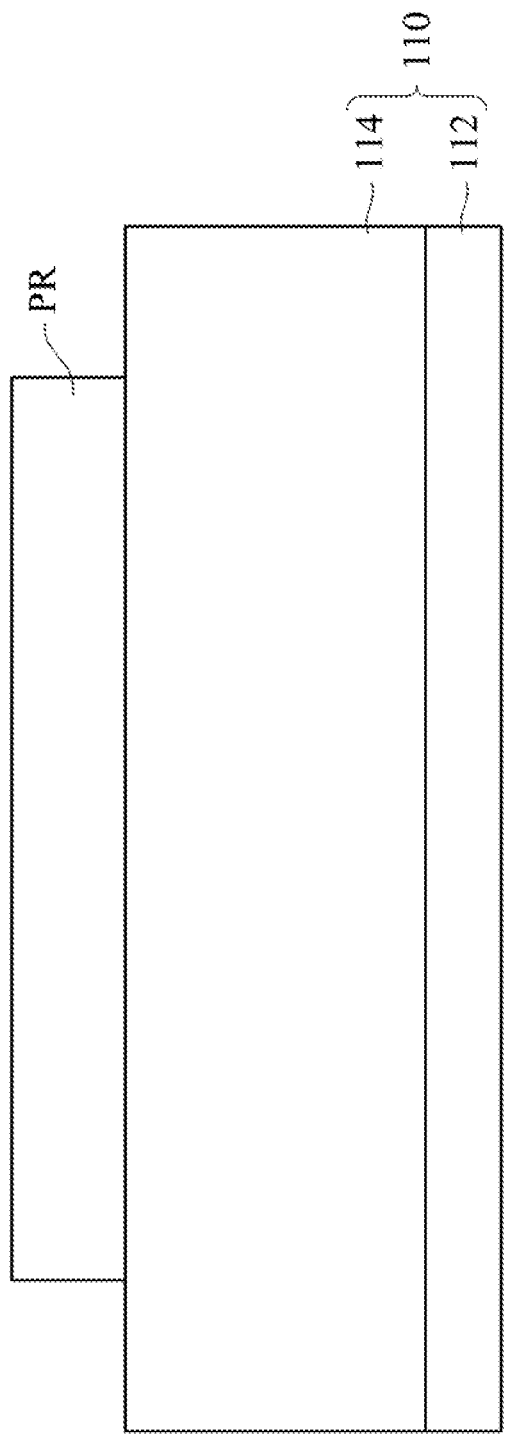
FIG. 1A to FIG. 1M are cross-sectional schematic views illustrating various steps of the manufacturing method of a semiconductor device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In addition, relative terms such as "lower" or "bottom" and "upper" or "top" can be used herein to describe the relationship between one element and another element, as shown in the figure. It should be understood that relative terms are intended to include different orientations of the device other than those shown in the figures. For example, if the device in one figure is turned over, elements described as being on the "lower" side of other elements will be oriented on the "upper" side of the other elements. Therefore, the exemplary term "lower" may include an orientation of "lower" and "upper", depending on the specific orientation of the drawing. Similarly, if the device in one figure is turned over, elements described as "below" other elements will be oriented "above" the other elements. Therefore, the exemplary term "below" can include an orientation of "above" and "below".

The present disclosure relates to a method for reducing the impedance of a semiconductor device (e.g., transistor). Specifically, the present disclosure improves the etching precision through only a single photolithography process with the time control of a wet etching process and the replacement of sacrificial layers, thereby precisely defining the limit value of the channel length of the semiconductor device. Hence, the channel length can be effectively shortened to reduce the impedance of the semiconductor device. In addition, the aforementioned method of the present disclosure can also reduce the number of uses of the photomask, thereby saving the cost of the photomask and reducing the cost.

FIG. 1A to FIG. 1M are cross-sectional schematic views illustrating various steps of the manufacturing method of a semiconductor device according to some embodiments of the present disclosure. The manufacturing method of the semiconductor device includes step S11-S23, and each step will be described sequentially accompanied with FIG. 1A to FIG. 1M below.

Reference is made to FIG. 1A. In step S11, a photoresist layer PR is formed on the substrate 110. Specifically, the substrate 110 includes a heavily doped layer 112 and an epitaxial layer 114 on the heavily doped layer 112. The substrate 110 may include any suitable material, and in some embodiments, substrate 110 includes silicon carbide. The heavily doped layer 112 and the epitaxial layer 114 can be formed by performing an epitaxial process on the substrate 110. The heavily doped layer 112 and the epitaxial layer 114 may include ion dopants of the same conductivity type (e.g., both of N-types or both of P-types), and the carrier concentration of the heavily doped layer 112 is higher than the ion concentration of the epitaxial layer 114. In some embodiments, both the heavily doped layer 112 and the epitaxial layer 114 are N-type doped regions. In step S11, the photoresist layer PR is formed on the substrate 110, and a portion of the substrate 110 is exposed by the photoresist layer PR.

Figure 1B:
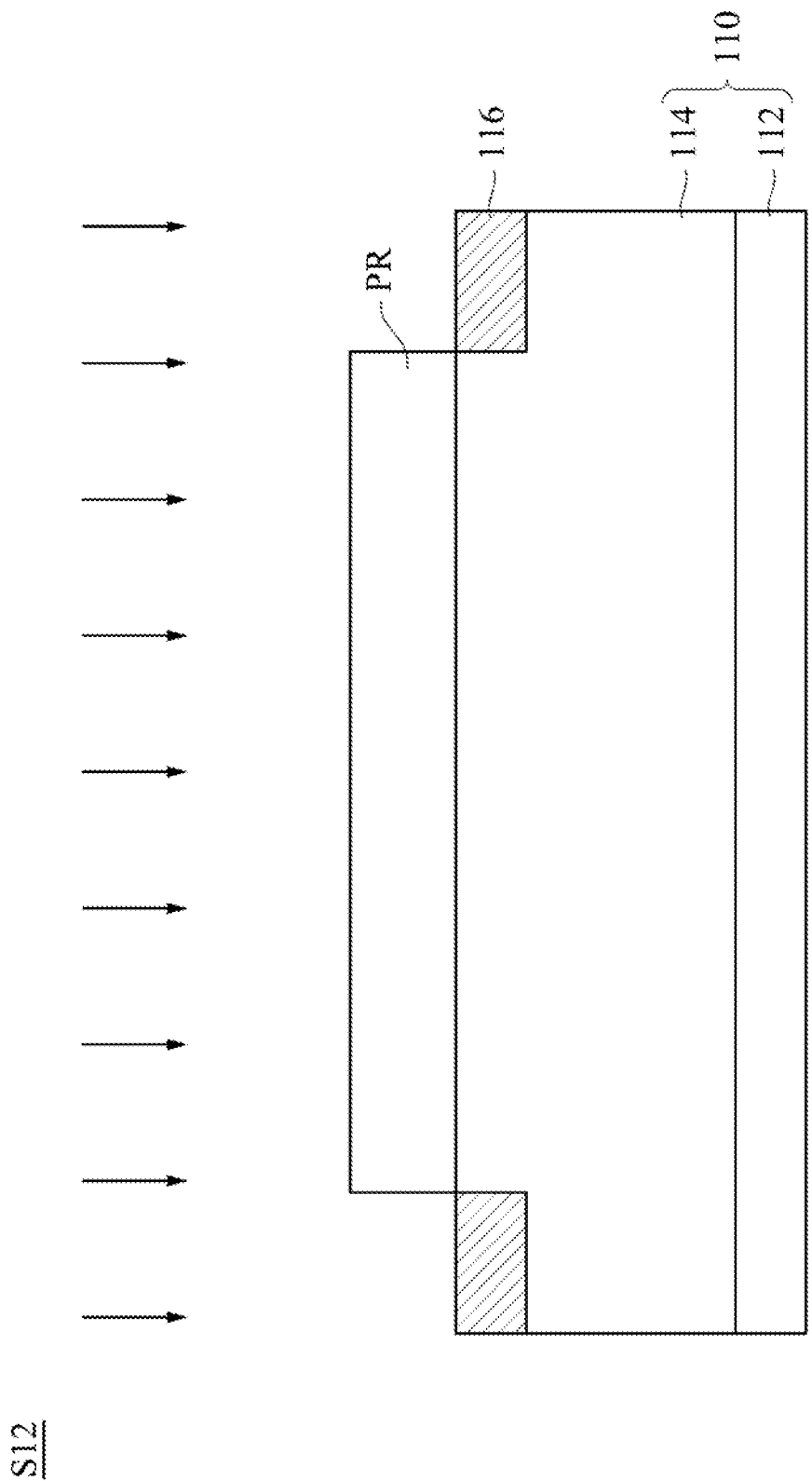

Reference is made to FIG. 1B. In step S12, a base region 116 is formed in the substrate 110 by using the photoresist layer PR as a mask. In some embodiments, the base region 116 is a P-type heavily doped region. Specifically, a P-type heavily doped implantation can be performed on the substrate 110 to form the base region 116 in the substrate 110. After the P-type heavily doped implantation is performed, the photoresist layer PR on the substrate 110 is removed. In some embodiments, the doping concentration of the base region 116 is higher than the doping concentration of the epitaxial layer 114.

Figure 1C:
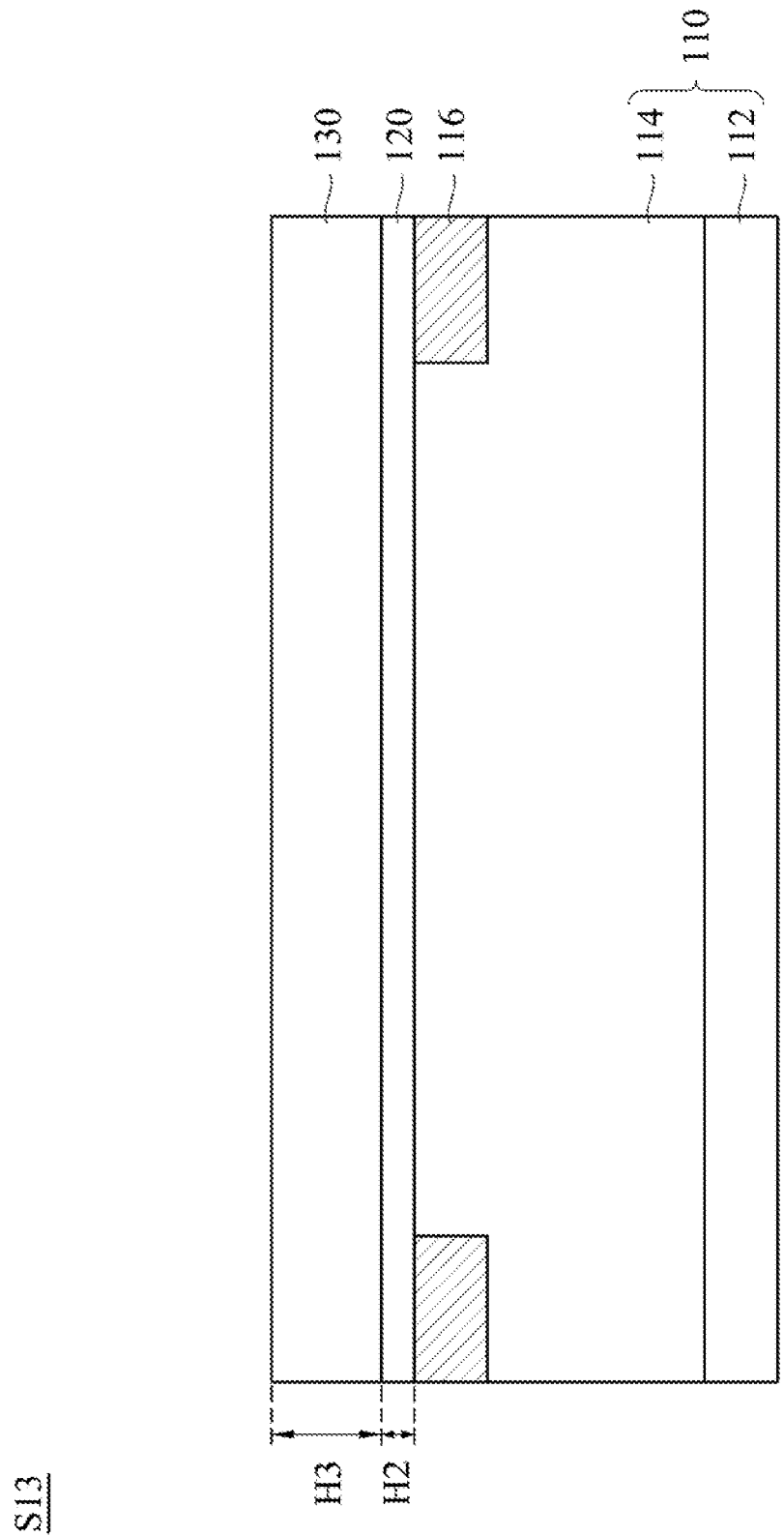

Reference is made to FIG. 1C. In step S13, after the photoresist layer PR is removed, the protective layer 120 and the first sacrificial layer 130 are sequentially formed on the substrate 110, and the protective layer 120 and the first sacrificial layer 130 cover the base region 116, in which the protective layer 120 may cover the entire surface of the substrate 110, and the first sacrificial layer 130 may cover the entire surface of the protective layer 120. In some embodiments, the photoresist layer PR can be removed by ashing, etching, and the like. In some embodiments, the protective layer 120 and the first sacrificial layer 130 may be made of different materials, for example, the protective layer 120 may include oxide (e.g., silicon dioxide), and the first sacrificial layer 130 may include nitride (e.g., silicon nitride) or polysilicon. The protective layer 120 can prevent cracks in materials, layers, or components due to thermal stress difference during thermal processing. It should be understood that although FIG. 1C shows the protective layer 120, in some other embodiments, when the entire manufacturing process of semiconductor device does not undergo a thermal process, the disposition of the protective layer 120 can be omitted. That is, the first sacrificial layer 130 can be directly disposed on the substrate 110 and directly in contact with the substrate 110 to cover the base region 116. In some embodiments, a thickness H3 of the first sacrificial layer 130 is greater than a thickness H2 of the protective layer 120. In some embodiments, the thickness H3 of the first sacrificial layer 130 is 6 to 8 times (e.g., 7 times) the thickness H2 of the protective layer 120.

Figure 1D:
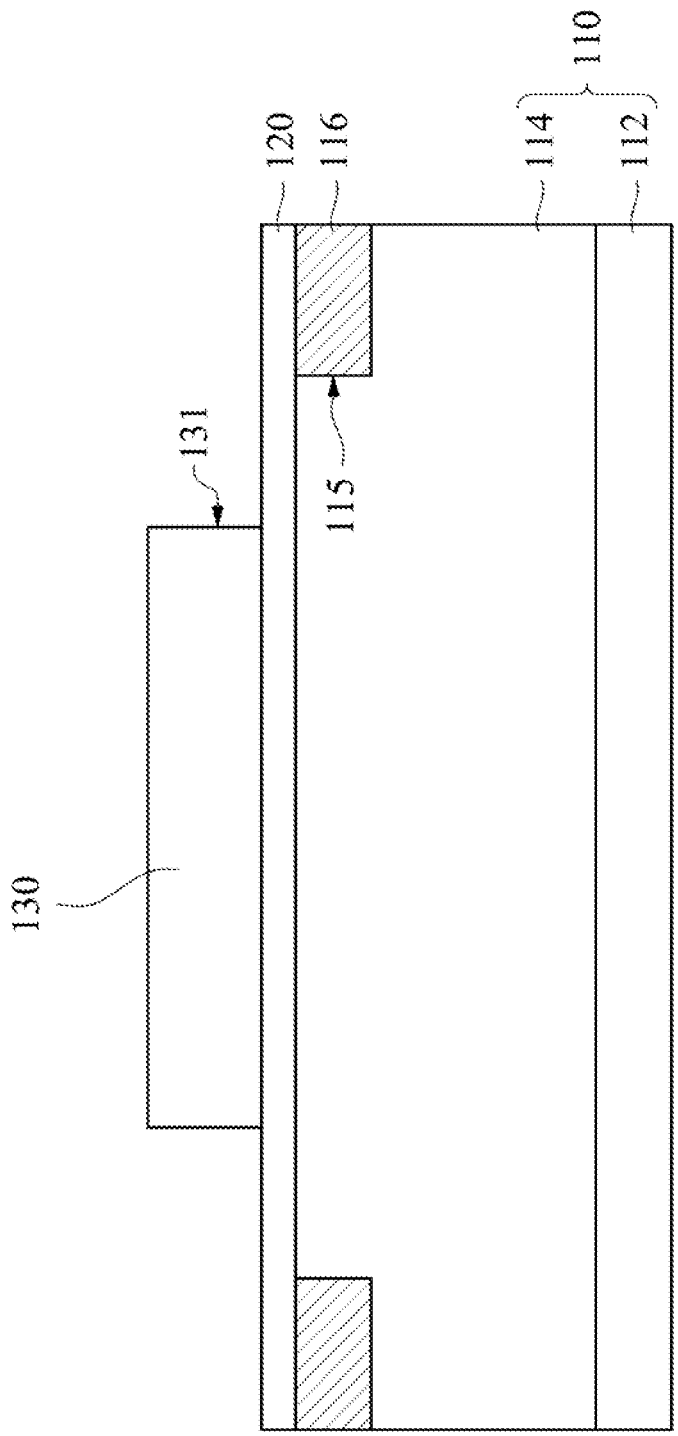

Reference is made to FIG. 1D. In step S14, a photolithography process and a first etching process are performed to pattern the first sacrificial layer 130 such that an outer sidewall 131 of the first sacrificial layer 130 is etched to a position on the substrate 110 at an inner side 115 of the base region 116. Specifically, the first etching process can be, for example, a wet etching process, and when the protective layer 120 and the first sacrificial layer 130 are both disposed on the substrate 110, a wet etching etchant with a high etching selectivity to the first sacrificial layer 130 can be used. That is, a wet etchant that is easy to etch the first sacrificial layer 130 but not easy to etch the protective layer 120 and the substrate 110 can be selected, so as to expose a portion of the protective layer 120 after etching, in which a vertical projection of the first sacrificial layer 130 on the substrate 110 does not cover the base region 116, and there is a distance between the vertical projection of the first sacrificial layer 130 on the substrate 110 and the base region 116. That is, there is a distance between a vertical projection of the outer sidewall 131 of the first sacrificial layer 130 on the substrate 110 and the inner side 115 of the base region 116. After performing the first etching process, the protective layer 120 is still in its original place without being etched. When the material of the protective layer 120 is silicon dioxide and the material of the first sacrificial layer 130 is silicon nitride, the wet etchant can be, for example, hot phosphoric acid, and in such an embodiment, the etching temperature of the wet etching process can be between 160° C. and 180° C., at such an etching temperature, the etching selectivity between the first sacrificial layer 130 and the protective layer 120 for the hot phosphoric acid is between 8:1 and 9:1, so as to ensure that a portion of the first sacrificial layer 130 is completely removed, and that the protective layer 120 remains in its original place without being removed. Since the wet etchant does not etch the substrate 110, the doped regions (e.g., the base region 116) on the substrate 110 will not be damaged, thereby reducing the impact of the wet etchant on the semiconductor device. In some other embodiments, when the material of the protective layer 120 is silicon dioxide, and the material of the first sacrificial layer 130 is polysilicon, the first etching process may be, for example, a dry etching process.

On the other hand, when the protective layer 120 is not provided in step S13, a wet etchant having a high etching selectivity to the first sacrificial layer 130 can also be used. That is, a wet etchant that is easy to etch the first sacrificial layer 130 but not easy to etch the substrate 110 can be selected to etch the first sacrificial layer 130, thereby exposing the underlying substrate 110, in which the first sacrificial layer 130 does not cover the base region 116, and a distance is between a vertical projection of the first sacrificial layer 130 on the substrate 110 and the base region 116. In some embodiments, when the first sacrificial layer 130 is silicon dioxide, the wet etchant may be hydrofluoric acid, and when the first sacrificial layer 130 is silicon nitride, the wet etchant may be hot phosphoric acid. Since the wet etchant does not substantially etch the substrate 110, the doped regions (e.g., the base region 116) on the substrate 110 will not be damaged, thereby reducing the impact of the wet etchant on the semiconductor device.

Overall, in step S14, the position of the source region 118 to be formed subsequently is defined through the photolithography process (see FIG. 1E), and then the first sacrificial layer 130 is etched through an anisotropic etching process to expose the position where the source region 118 is to be formed. Since removing the first sacrificial layer 130 with a wet etchant does not cause etching saturation, the etching-back length of the first sacrificial layer 130 can be precisely defined, and thus the position of the source region 118 can be precisely defined.

Figure 1E:
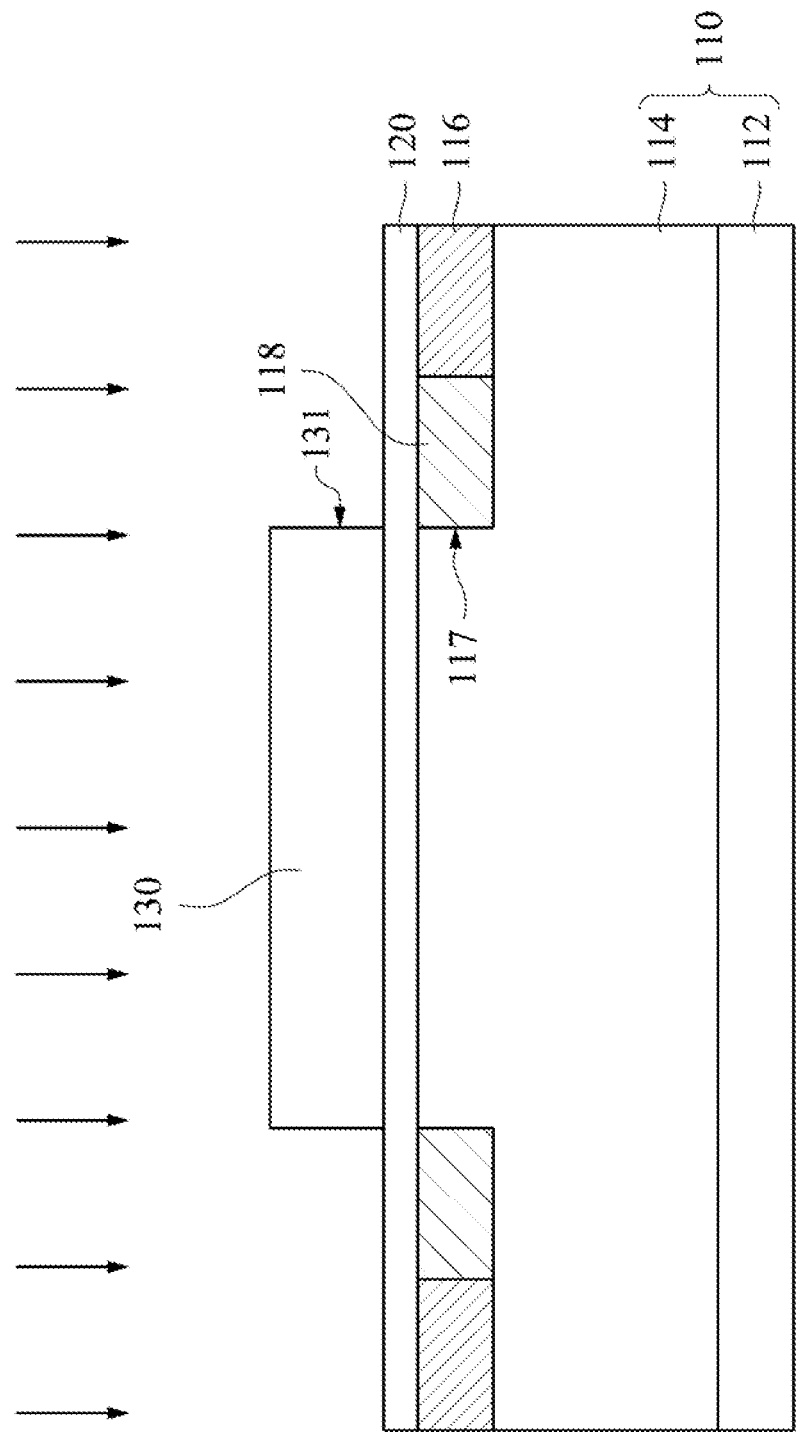

Reference is made to FIG. 1E. In step S15, the source region 118 is formed in the substrate 110 by using the first sacrificial layer 130 as a mask, and the source region 118 is adjacent to the base region 116. In some embodiments, the source region 118 is an N-type heavily doped region.

Specifically, an N-type heavily doped implantation can be performed on the substrate 110 to form the source region 118 in the substrate 110. When both the protective layer 120 and the first sacrificial layer 130 are disposed on the substrate 110, dopants can penetrate through the protective layer 120 to be implanted into the substrate 110. The source region 118 is formed between the base region 116 and the vertical projection of the first sacrificial layer 130 on the substrate 110, and an inner side 117 of the source region 118 is substantially aligned with the outer sidewall 131 of the first sacrificial layer 130. When the protective layer 120 is not provided in step S13, the source region 118 can also be formed between the base region 116 and the vertical projection of the first sacrificial layer 130 on the substrate 110, and the inner side 117 of the source region 118 can also be substantially aligned with the outer sidewall 131 of the first sacrificial layer 130. In some embodiments, the doping concentration of the source region 118 is higher than the doping concentration of the epitaxial layer 114. In some embodiments, a hard mask layer can be formed on the base region 116 when the source region 118 is formed, such that the base region 116 is not affected when the source region 118 is formed. Alternatively, in FIG. 1B, the doping concentration of the base region 116 is increased, such that when the source region 118 is formed, the ion concentration of the base region 116 can be adjusted to a desired concentration.

Figure 1F:
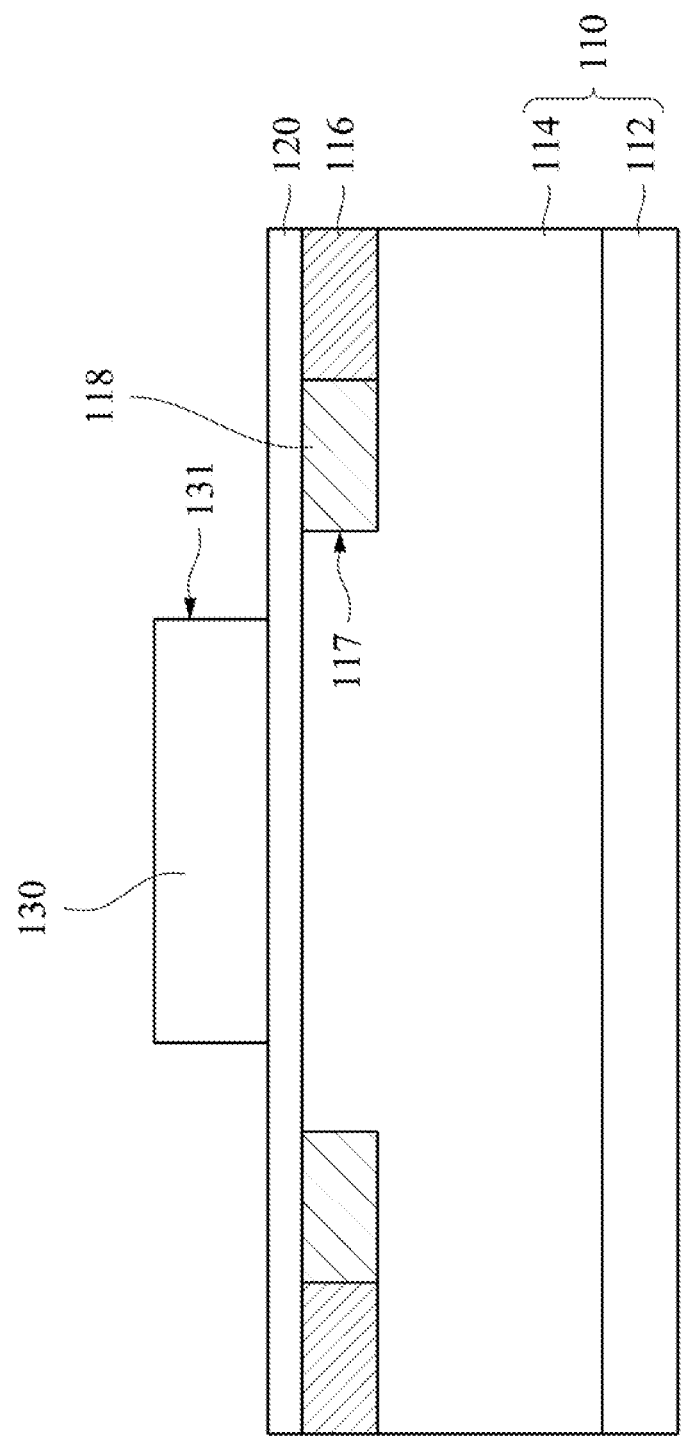

Reference is made to FIG. 1F. In step S16, a second etching process is performed to etch back the outer sidewall 131 of the first sacrificial layer 130 to a position on the substrate 110 at the inner side 117 of the source region 118, such that the vertical projection of the first sacrificial layer 130 on the substrate 110 does not cover the source region 118. That is, there is a distance between the vertical projection of the outer sidewall 131 of the first sacrificial layer 130 on the substrate 110 and the inner side 117 of the source region 118. Specifically, the second etching process may be, for example, an isotropic wet etching process, and the wet etchant used may be the same as the wet etchant used in the first wet etching process. Since the wet etchant does not substantially etch the substrate 110, the doped regions (e.g., the base region 116 and the source region 118) on the substrate 110 will not be damaged, thereby reducing the impact of the wet etchant on the semiconductor device. After performing the second etching process, there is a distance between the vertical projection of the first sacrificial layer 130 on the substrate 110 and the inner side 117 of the source region 118, and the protective layer 120 is still in is original place without being etched. When the protective layer 120 is not provided in step S13, the outer sidewall 131 of the first sacrificial layer 130 can also be etched back, such that the vertical projection of the first sacrificial layer 130 on the substrate 110 does not cover the source region 118, and a distance is between the vertical projection of the first sacrificial layer 130 on the substrate 110 and the source region 118.

In some embodiments, the etching-back length of the first sacrificial layer 130 can be precisely controlled by controlling the time of the wet etching process. Specifically, when performing the second wet etching process, the time of the second wet etching process is controlled according to the etching-back degree of the outer sidewall 131 of the first sacrificial layer 130. Since the etching rate of a wet etchant for a specific material is fixed (or calculable), the required etching time can be calculated based on the desired etching-back length. In some embodiments, the etching-back length of the first sacrificial layer 130 is approximately between 200 nm and 2000 nm.

Figure 1G:
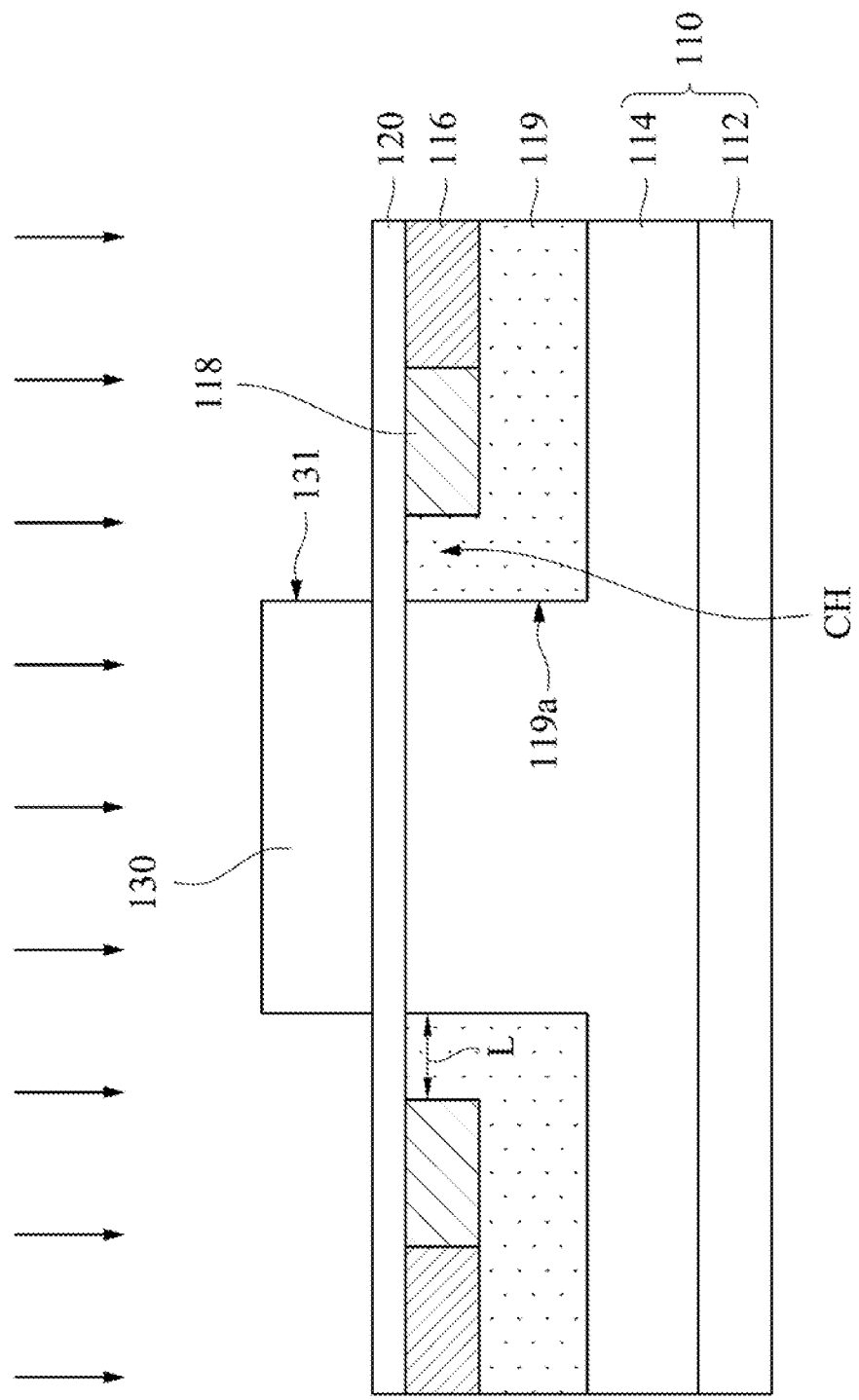

Reference is made to FIG. 1G. In step S17, a well region 119 is formed in the substrate 110 by using the first sacrificial layer 130 as a mask. The well region 119 is adjacent to the source region 118 and in contact with a bottom portion of the base region 116 and a bottom portion of the source region 118. In some embodiments, the well region 119 may be, for example, a P-type lightly doped region. Specifically, a P-type lightly doped implantation can be performed on the substrate 110 to form the well region 119 in the substrate 110. When both the protective layer 120 and the first sacrificial layer 130 are disposed on the substrate 110, dopants can penetrate through the protective layer 120 to be implanted into the substrate 110. The well region 119 is formed between the source region 118 and the vertical projection of the first sacrificial layer 130 on the substrate 110, and an inner side 119a of the well region 119 is substantially aligned with the outer sidewall 131 of the first sacrificial layer 130. When the protective layer 120 is not provided in step S13, the well region 119 can also be formed between the source region 118 and the vertical projection of the first sacrificial layer 130 on the substrate 110, and the inner side 119a of the well region 119 is substantially aligned with the outer sidewall 131 of the first sacrificial layer 130.

The well region 119 may include a channel region CH adjacent to the source region 118, and a length L of the channel region CH is 200 nm to 2000 nm. In this embodiment, the base region 116 and the source region 118 are formed firstly, and then the well region 119 is formed. Therefore, the etching-back length of the first sacrificial layer 130 can be gradually controlled by precisely controlling the time of the wet etching process, and the length L of the channel region CH of the well region 119 can also be precisely controlled. In this way, the length L of the channel region CH can be controlled at the limit value (i.e., the shortest acceptable length L of the channel region CH) of the device. Therefore, the impedance contributed by the channel region CH is reduced, thereby reducing the overall impedance of the semiconductor element. In addition, if the length L of the channel region CH is the shortest acceptable length, the size of the semiconductor device can be reduced accordingly.

The well region 119 further covers (encapsulates) the base region 116 and the source region 118 along the vertical direction. The breakdown voltage between the well region 119 and the epitaxial layer 114 is higher than the breakdown voltage between the base region 116 and the epitaxial layer 114. Therefore, when the well region 119 covers the bottom portion of the base region 116 and the bottom portion of the source region 118, the semiconductor device can withstand a higher voltage without being easily damaged.

Figure 1H:
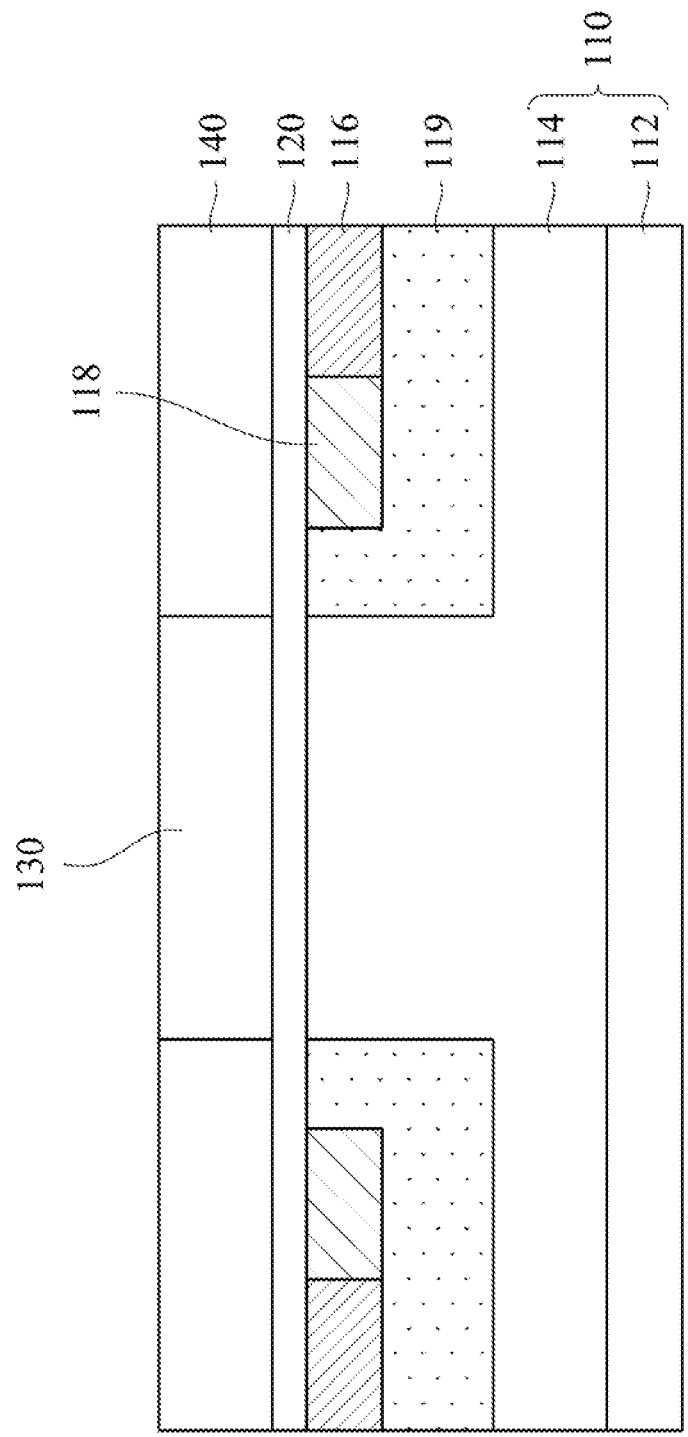

Reference is made to FIG. 1H. In step S18, a second sacrificial layer 140 is formed on the substrate 110, and the second sacrificial layer 140 covers the base region 116, the source region 118, and the well region 119. Specifically, a dielectric material can be deposited on the substrate 110 such that the dielectric material completely covers the first sacrificial layer 130 and the protective layer 120, and then the excess dielectric material is removed such that the second sacrificial layer 140 and the first sacrificial layer 130 have substantially flat top surfaces. In some embodiments, when the dielectric material is silicon on glass, (SOG), excess dielectric material can be removed by wet etching, and the selected wet etchant can be, for example, hydrofluoric acid, buffered oxide etch (BOE), or a combination thereof. In some other embodiments, when the dielectric material is silicon dioxide, the excess dielectric material can be removed by chemical mechanical planarization (CMP), and in this embodiment, since the material of the protective layer 120 is also silicon dioxide, there is no substantial interface between the protective layer 120 and the formed second sacrificial layer 140. On the other hand, when the protective layer 120 is not provided in step S13, the second sacrificial layer 140 is directly in contact with the base region 116, the source region 118, and the well region 119, and the second sacrificial layer 140 and the first sacrificial layer 130 have substantially flat top surfaces.

Figure 1I:
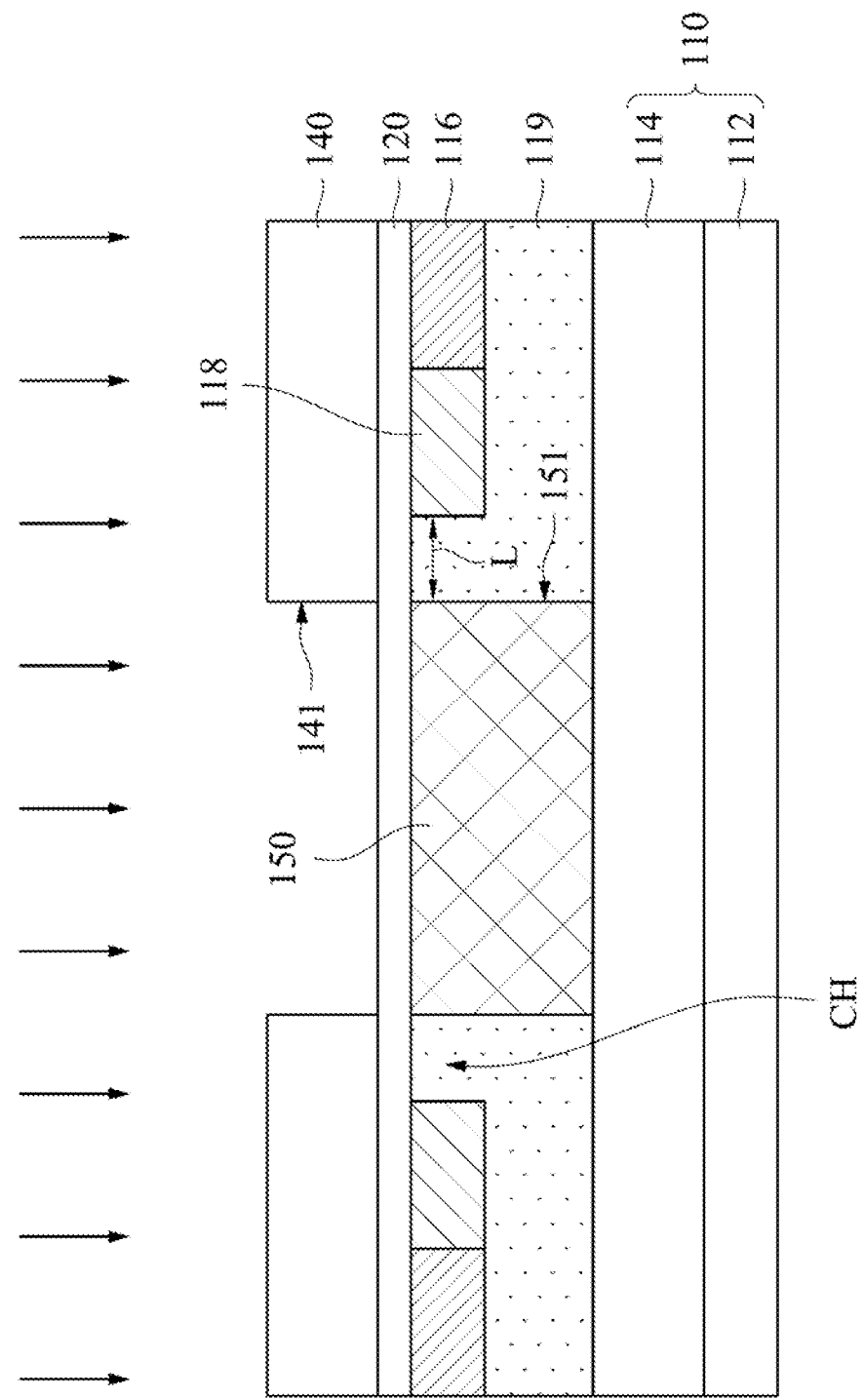

Reference is made to FIG. 1I. In step S19, a third etching process is performed to remove the first sacrificial layer 130, and then a junction field effect transistor (JFET) region 150 is formed in the substrate 110 by using the second sacrificial layer 140 as a mask. More specifically, the third etching process can be, for example, a wet or dry etching process. In detail, when the material of the first sacrificial layer 130 is silicon nitride, and the materials of the second sacrificial layer 140 and the protective layer 120 are silicon dioxide, the third etching process is a wet etching process; when the material of the layer 130 is polysilicon, and the materials of the second sacrificial layer 140 and the protective layer 120 are silicon dioxide, the third etching process is a dry etching process. In order to save the use of a mask and improve the convenience of the process, the third etching process is preferably a wet etching process, and in such an embodiment, the wet etchant can be hot phosphoric acid, and the etching temperature of the wet etching process can be between 160° C. and 180° C., at this etching temperature, the etching selectivity between the first sacrificial layer 130 and the second sacrificial layer 140 for hot phosphoric acid is between 8:1 and 9:1 to ensure that a portion of the first sacrificial layer 130 is completely removed, while the second sacrificial layer 140 and the protective layer 120 are still in their original place without being removed. After completing this step, a portion of the protective layer 120 is exposed due to the removal of the first sacrificial layer 130; and when the protective layer 120 is not provided in step S13, a portion of the substrate 110 is exposed due to the removal of the first sacrificial layer 130.

Next, the junction field effect transistor region 150 is formed in the substrate 110 by using the second sacrificial layer 140 as a mask. The junction field effect transistor region 150 is adjacent to and in contact with the well region 119, in which the junction field effect transistor region 150 and the well region 119 have substantially flat bottoms, and a distance is between the junction field effect transistor region 150 and the source region 118. In some embodiments, the junction field effect transistor region 150 is an N-type lightly doped region. Specifically, an N-type lightly doped implantation can be performed on the substrate 110 to form the junction field effect transistor region 150 in the substrate 110. When both the protective layer 120 and the first sacrificial layer 130 are disposed on the substrate 110, dopants can penetrate through the protective layer 120 to be implanted into the substrate 110. The junction field effect transistor region 150 is formed between two adjacent well regions 119, and an outer side 151 of the junction field effect transistor region 150 is substantially aligned with an inner sidewall 141 of the second sacrificial layer 140. When the protective layer 120 is not provided in step S13, the junction field effect transistor region 150 can also be formed between two adjacent well regions 119, and the outer side 151 of the junction field effect transistor region is substantially aligned with an inner sidewall 141 of the second sacrificial layer 140. On the other hand, the channel region CH extends from the inner side 117 of the source region 118 to the outer side 151 of the junction field effect transistor region 150.

Overall, in this embodiment, the etching-back length of the first sacrificial layer 130 is gradually controlled by precisely controlling the time of the wet etching process, so as to accurately define the position of two ion-doped regions (source region 118 and well region 119), then to define the covering area of the second sacrificial layer 140 through the etched-back first sacrificial layer 130, and then to precisely define the position of another ion-doped region (junction field effect transistor region 150) by using the second sacrificial layer 140 as a mask. In this way, the length L of the channel region CH extending between the source region 118 and the junction field effect transistor region 150 can be precisely controlled, thereby reducing the resistance of the semiconductor device. In addition, it is worth noting that in this embodiment, three ion-doped regions can be formed by only a single photolithography process (step S14, FIG. 1D), which saves mask costs and reduces costs.

Figure 1J:
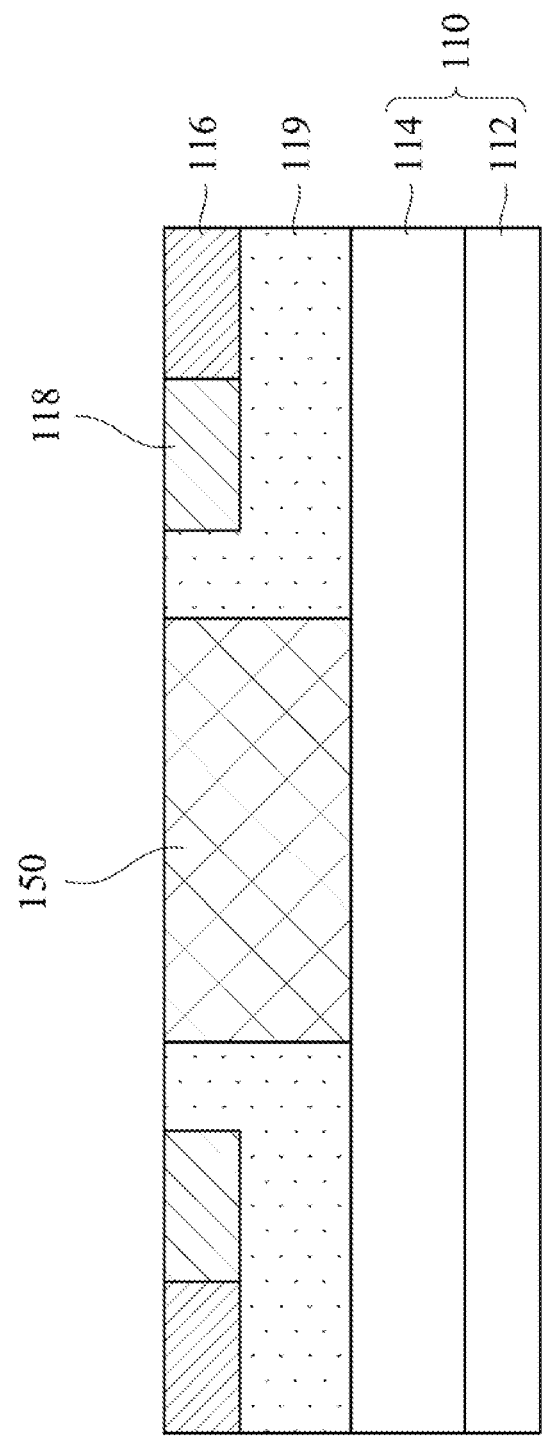

Reference is made to FIG. 1J. In step S20, the second sacrificial layer 140 and the protective layer 120 are removed to expose the substrate 110 and the base region 116, the source region 118, the well region 119, and the junction field effect transistor region 150 in the substrate 110. In some embodiments, the second sacrificial layer 140 and the protective layer 120 can be removed simultaneously by dry etching, wet etching, or a combination thereof. In some embodiments, when the second sacrificial layer 140 and the protective layer 120 are silicon dioxide, the wet etchant may be hydrofluoric acid. After removing the second sacrificial layer 140 and the protective layer 120, an annealing process may be performed on the base region 116, the source region 118, the well region 119, and the junction field effect transistor region 150 to repair the lattice defects of the doped regions (the base region 116, the source region 118, the well region 119, and the junction field effect transistor region 150) of the substrate 110, and make the dopants diffuse to the lattice replacement position of the substrate 110, such that the dopants is activated to be the dopant atoms with semiconducting electrical properties. It should be understood that when the protective layer 120 is not provided in step S13, only the second sacrificial layer 140 is removed in this step to expose the substrate 110 and the base region 116, the source region 118, and the well region 119 in the substrate.

Figure 1K:
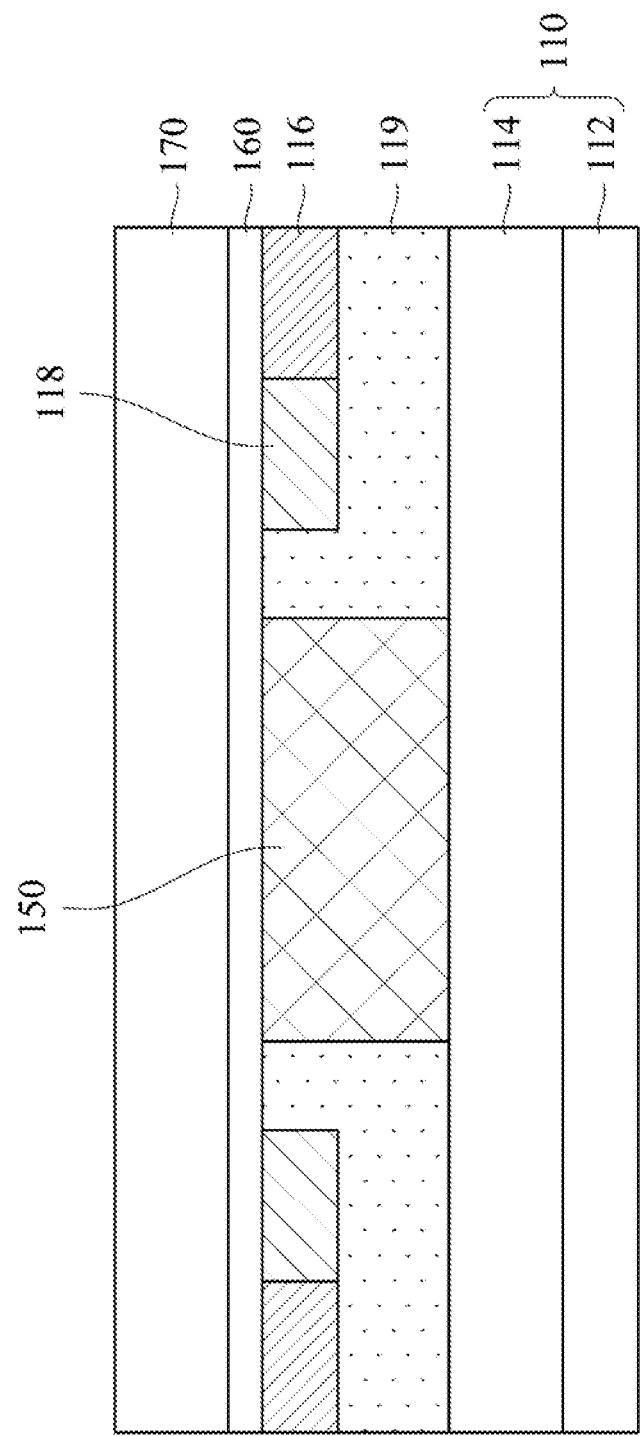

Reference is made to FIG. 1K. In step S21, a dielectric layer 160 is formed on the substrate 110, and a conductive layer 170 is formed on the dielectric layer 160 and covers the dielectric layer 160. In some embodiments, the dielectric layer 160 may include silicon oxide, silicon nitride, silicon oxynitride, polysilicon, combinations thereof, or the like. In some embodiments, the conductive layer 170 may include polysilicon, metal, metal compound, combinations thereof, or the like.

Figure 1L:
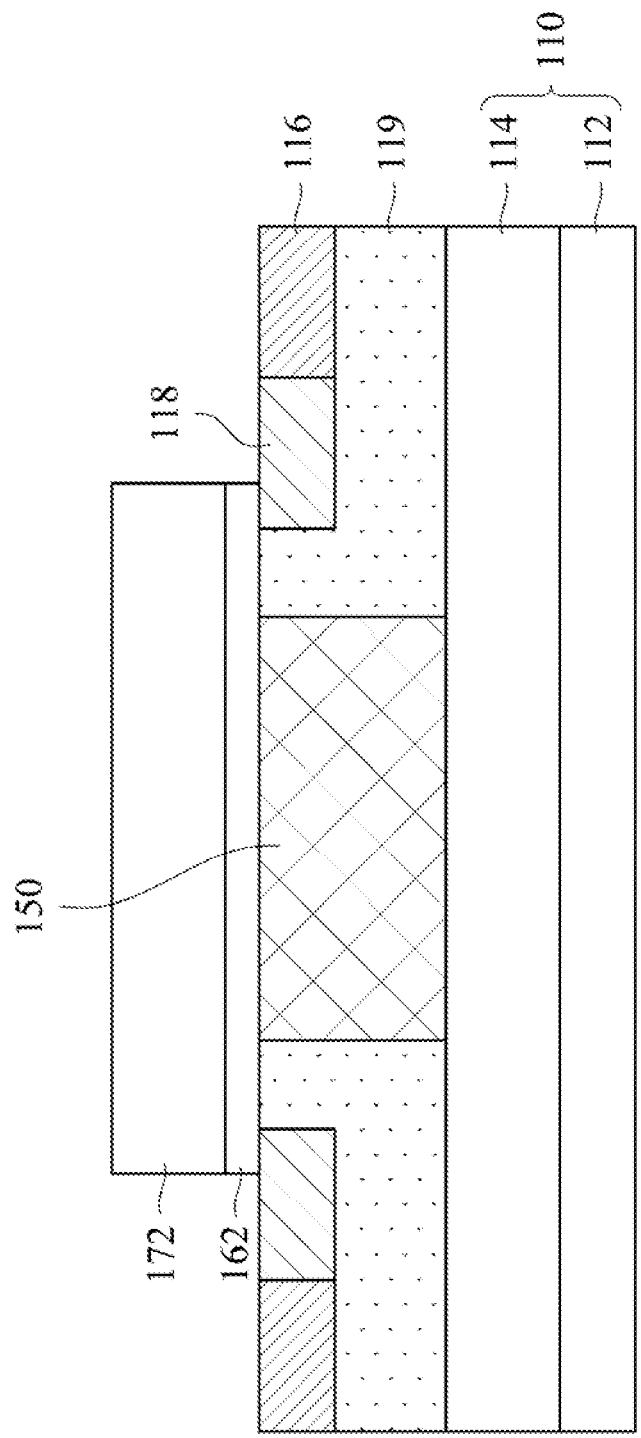

Reference is made to FIG. 1L. In step S22, the dielectric layer 160 and the conductive layer 170 are patterned to form a gate dielectric layer 162 and a gate layer 172 on the substrate 110. In some embodiments, the conductive layer 170 can be patterned firstly to form the gate layer 172, and then the dielectric layer 160 can be patterned to form the gate dielectric layer 162 by using the gate layer 172 as a mask. Therefore, the sidewalls of the gate dielectric layer 162 and the gate layer 172 can be aligned with each other. The gate dielectric layer 162 is in contact with the source region 118, and the gate dielectric layer 162 covers the junction field effect transistor region 150 and a portion of the well region 119 at the surface of the substrate 110. That is, the gate dielectric layer 162 extends from a source region 118 at one side to another source region 118 at another side.

Figure 1M:
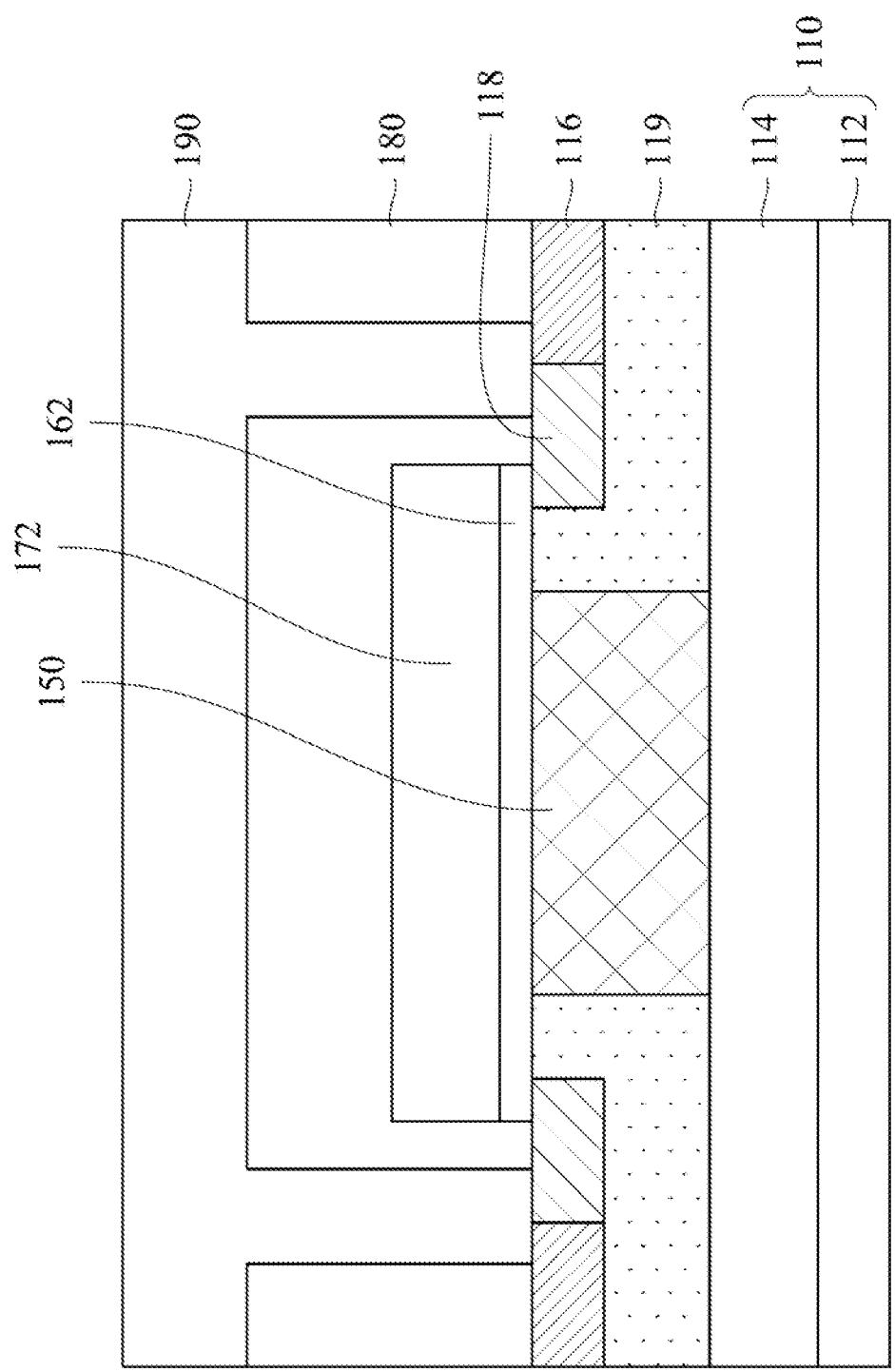

Reference is made to FIG. 1M. In step S23, a dielectric layer 180 may be formed on the gate dielectric layer 162 and the gate layer 172. Next, a source contact 190 is formed in the dielectric layer 180. Specifically, the dielectric layer 180 can be formed on the gate dielectric layer 162 and the gate layer 172 firstly, such that the dielectric layer 180 covers the gate dielectric layer 162, the gate layer 172, and the substrate 110. An opening is then formed in the dielectric layer 180, and then a source contact 190 is formed in the opening. A source contact 190 is in contact with the base region 116 and the source region 118. On the other hand, a drain electrode may be formed under the substrate 110. The drain electrode may be under the heavily doped layer 112 and in contact with the heavily doped layer 112.

After completing the above steps, the resulting semiconductor device can be as shown in FIG. 1M. The semiconductor device may include a substrate 110, a base region 116, a source region 118, a well region 119, a junction field effect transistor region 150, a gate dielectric layer 162, and a gate layer 172. The base region 116 is in the substrate 110. The source region 118 is in the substrate 110 and adjacent to the base region 116. The well region 119 is in the substrate 110 and surrounds the base region 116 and the source region 118. The junction field effect transistor region 150 is adjacent to the source region 118 and has a distance from the source region 118. The gate dielectric layer 162 covers the junction field effect transistor region 150, a portion of the well region 119, and a portion of the source region 118. The gate layer 172 is on the gate dielectric layer 162.

FIG. 2A to FIG. 2K are cross-sectional schematic views illustrating various steps of the manufacturing method of a semiconductor device according to some other embodiments of the present disclosure. The manufacturing method of the semiconductor device includes step S31-S44, and each step will be described sequentially accompanied with FIG. 2A to FIG. 2K below.

Figure 2A:
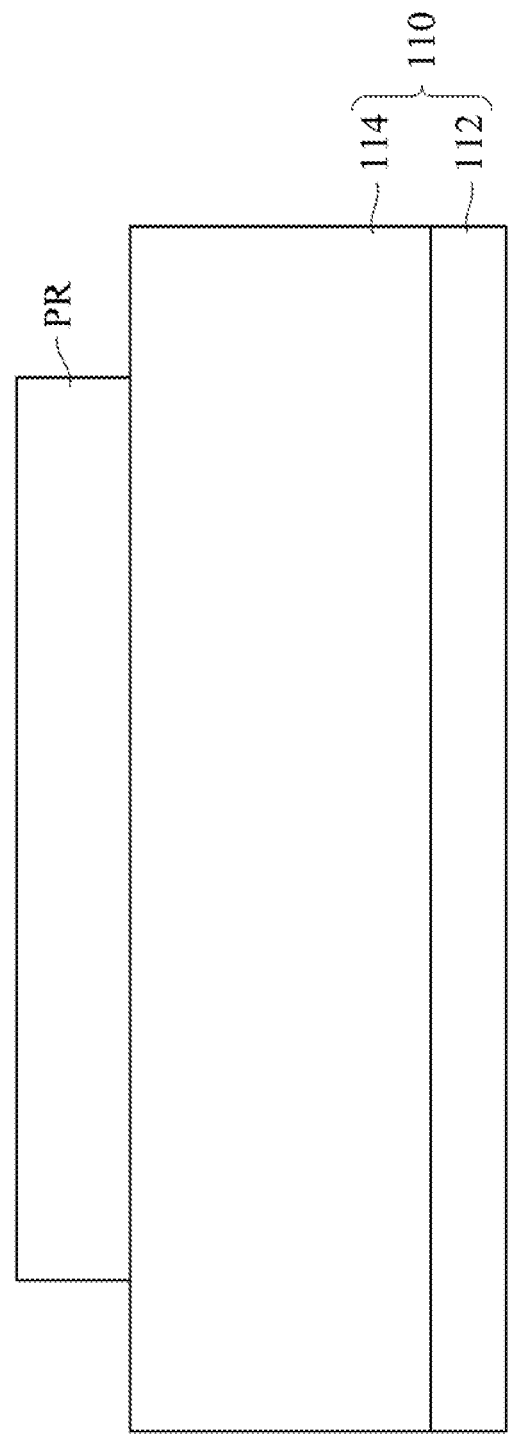
FIG. 2A to FIG. 2K are cross-sectional schematic views illustrating various steps of the manufacturing method of a semiconductor device according to some other embodiments of the present disclosure.
Figure 2B:
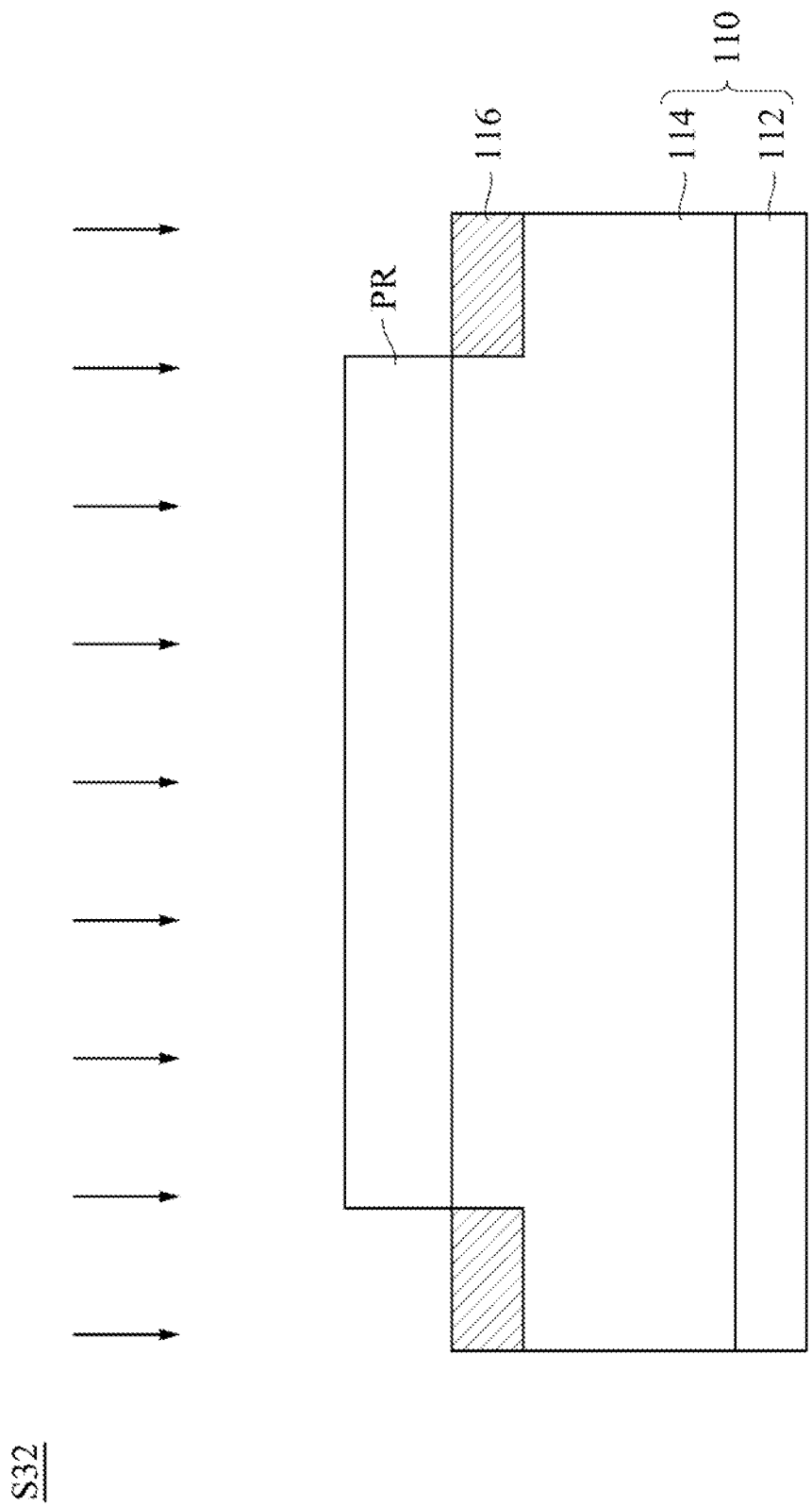
Figure 2C:
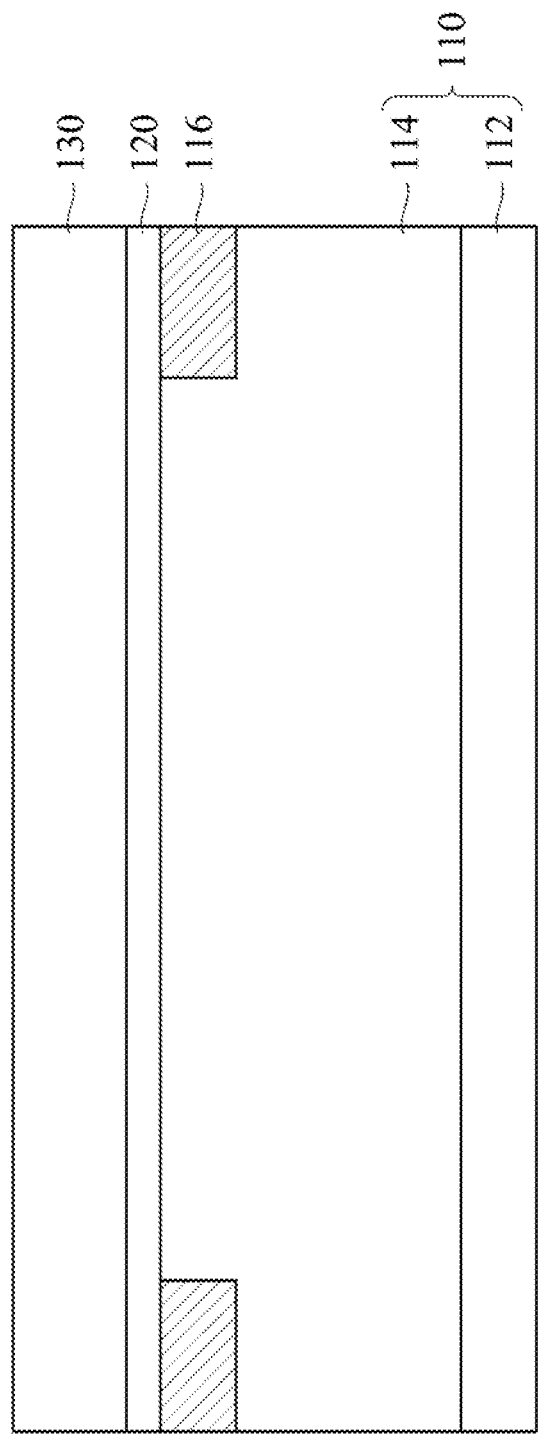

Reference is made to FIG. 2A to FIG. 2C. Steps S31 to S33 in FIG. 2A to FIG. 2C are the same as steps S11 to S13 in FIG. 1A to FIG. 1C mentioned above. For details, please refer to the previous description, which will not be repeated hereinafter.

Figure 2D:
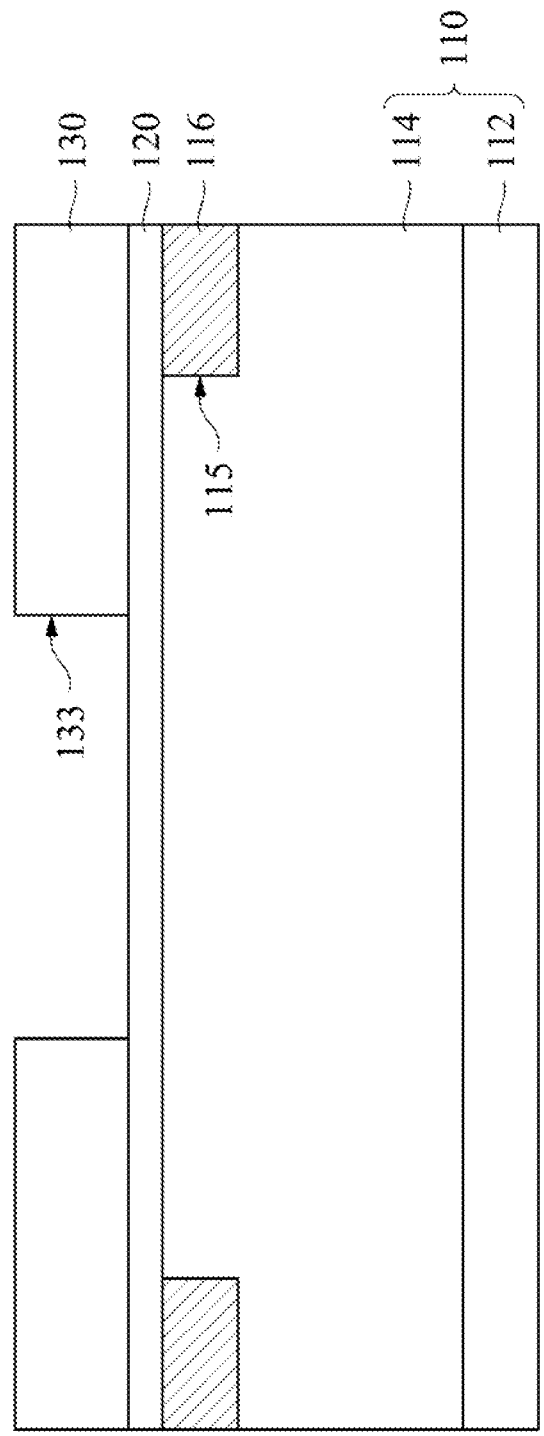

Reference is made to FIG. 2D. In step S34, a photolithography process and first etching process are performed to pattern the first sacrificial layer 130 such that an inner sidewall 133 of the first sacrificial layer 130 is etched to a position at the inner side 115 of the base region 116. After the first etching process, the first sacrificial layer 130 still covers the base region 116, and there is a distance between the vertical projection of the inner sidewall 133 of the first sacrificial layer 130 on the substrate 110 and the inner side 115 of the base region 116. Specifically, the first etching process can be, for example, a wet etching process, and when the protective layer 120 and the first sacrificial layer 130 are both disposed on the substrate 110, a wet etchant with a high etching selectivity to the first sacrificial layer 130 can be used. That is, a wet etchant that is easy to etch the first sacrificial layer 130 but not easy to etch the protective layer 120 and the substrate 110 may be selected, so as to expose a portion of the protective layer 120 after etching. After performing the first etching process, the protective layer 120 is still in is original place without being etched. When the material of the protective layer 120 is silicon dioxide and the material of the first sacrificial layer 130 is silicon nitride, the wet etchant can be, for example, hot phosphoric acid, and in such an embodiment, the etching temperature of the wet etching process can be between 160° C. and 180° C., at such an etching temperature, the etching selectivity between the first sacrificial layer 130 and the protective layer 120 for the hot phosphoric acid is between 8:1 and 9:1, so as to ensure that a portion of the first sacrificial layer 130 is completely removed, and that the protective layer 120 remains in its original place without being removed. Since the doped region (e.g., the base region 116) is covered by the mask, it will not be damaged. In some other embodiments, when the material of the protective layer 120 is silicon dioxide, and the material of the first sacrificial layer 130 is polysilicon, the first etching process may be, for example, a dry etching process.

On the other hand, when the protective layer 120 is not provided in step S33, a wet etchant having a high etch selectivity to the first sacrificial layer 130 can also be used. That is, a wet etchant that is easy to etch the first sacrificial layer 130 but not easy to etch the substrate 110 may be selected, thereby exposing the underlying substrate 110, in which the first sacrificial layer 130 still covers the base region 116, and a distance is between a vertical projection of the inner sidewall 133 of the first sacrificial layer 130 on the substrate 110 and the inner side 115 of the base region 116. In some embodiments, when the first sacrificial layer 130 is silicon dioxide, the wet etchant may be hydrofluoric acid, and when the first sacrificial layer 130 is silicon nitride, the wet etchant may be hot phosphoric acid.

Overall, in step S34, the position of the junction field effect transistor region 150 to be formed later is defined through the photolithography process (see FIG. 2E), and then the first sacrificial layer 130 is etched through an anisotropic etching process to expose the position where the junction field effect transistor region 150 is to be formed. Since removing the first sacrificial layer 130 with a wet etchant does not cause etching saturation, the etching length of the first sacrificial layer 130 can be precisely defined, and thus the position of the junction field effect transistor region 150 can be precisely defined.

Figure 2E:
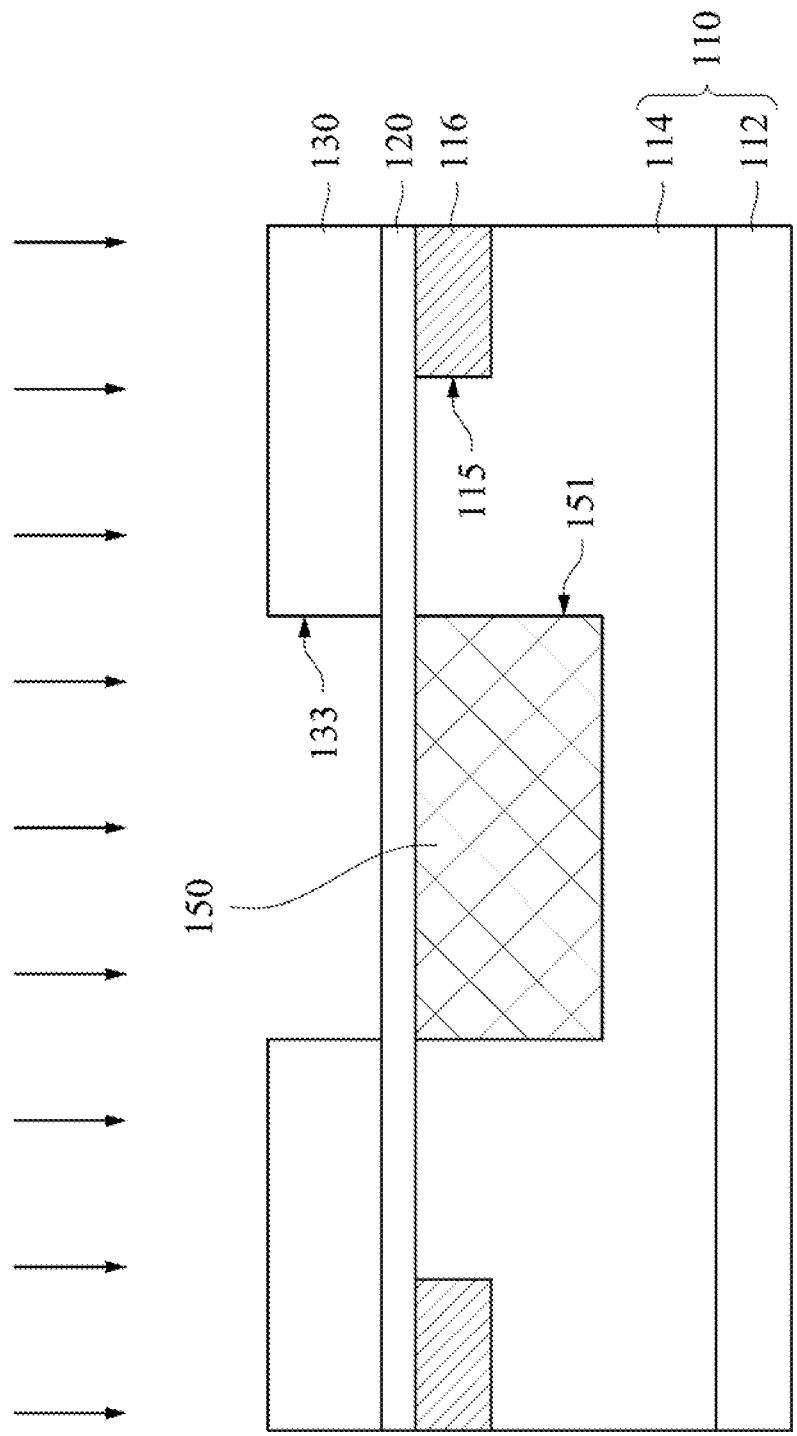

Reference is made to FIG. 2E. In step S35, the junction field effect transistor region 150 is formed in the substrate 110 by using the first sacrificial layer 130 as a mask, in which the junction field effect transistor region 150 is adjacent to the base region 116, and a distance is between the junction field effect transistor region 150 and the inner side 115 of the base region 116. In some embodiments, the junction field effect transistor region 150 is an N-type lightly doped region. Specifically, an N-type lightly doped implantation can be performed on the substrate 110 to form the junction field effect transistor region 150 in the substrate 110. When both the protective layer 120 and the first sacrificial layer 130 are disposed on the substrate 110, dopants can penetrate through the protective layer 120 to be implanted into the substrate 110. The junction field effect transistor region 150 is formed between two adjacent base regions 116, and the outer side 151 of the junction field effect transistor region 150 is substantially aligned with the inner sidewall 133 of the first sacrificial layer 130. When the protective layer 120 is not provided in step S33, the junction field effect transistor region 150 can also be formed between two adjacent base regions 116, and the outer side 151 of the junction field effect transistor region 150 is substantially aligned with the inner sidewall 133 of the first sacrificial layer 130.

Figure 2F:
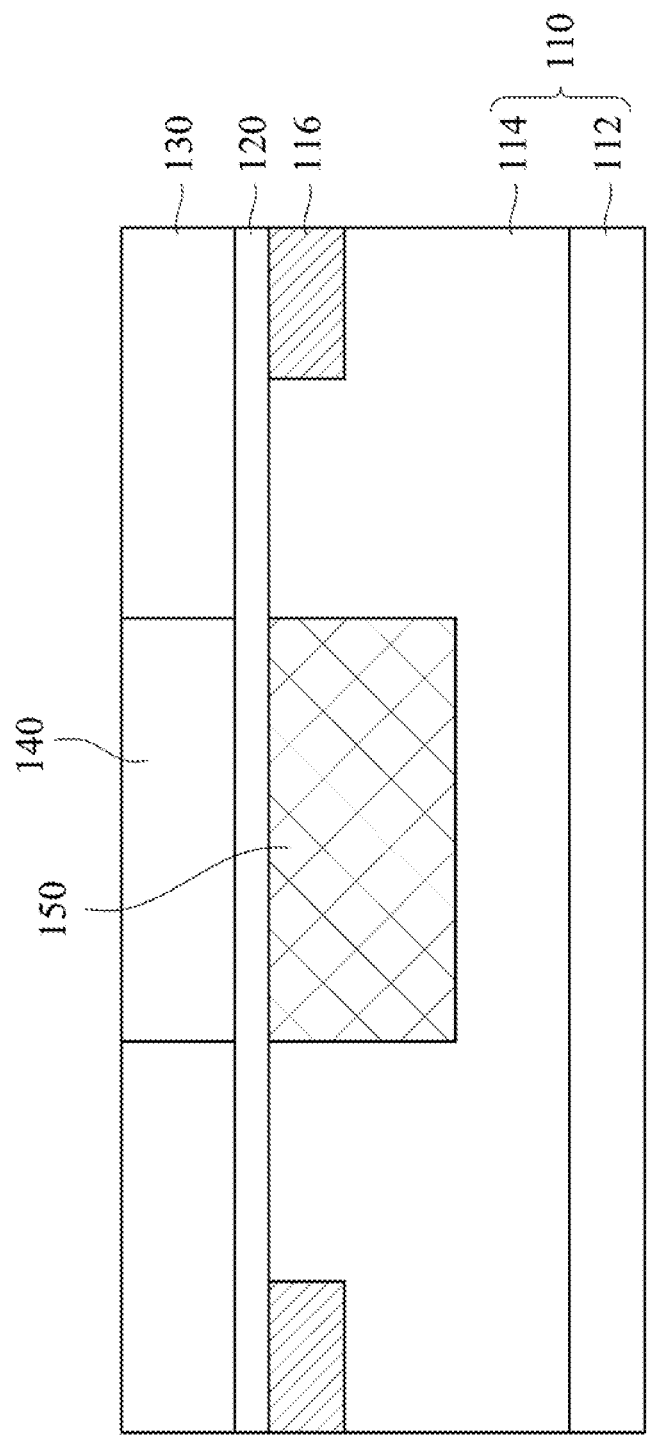

Reference is made to FIG. 2F. In step S36, a second sacrificial layer 140 is formed on the substrate 110, and the second sacrificial layer 140 covers the junction field effect transistor region 150. Specifically, a dielectric material can be deposited on the substrate 110 such that the dielectric material completely covers the first sacrificial layer 130 and the protective layer 120, and then the excess dielectric material is removed such that the second sacrificial layer 140 and the first sacrificial layer 130 have substantially flat top surfaces. In some embodiments, when the dielectric material is silicon on glass, (SOG), excess dielectric material can be removed by wet etching, and the selected wet etchant can be, for example, hydrofluoric acid, buffered oxide etch (BOE), or a combination thereof. In some other embodiments, when the dielectric material is silicon dioxide, the excess dielectric material can be removed by chemical mechanical planarization (CMP), and in this embodiment, since the material of the protective layer 120 is also silicon dioxide, there is no substantial interface between the protective layer 120 and the formed second sacrificial layer 140. On the other hand, when the protective layer 120 is not provided in step S33, the second sacrificial layer 140 is directly in contact with the junction field effect transistor region 150, and the second sacrificial layer 140 and the first sacrificial layer 130 have substantially flat top surfaces.

Figure 2G:
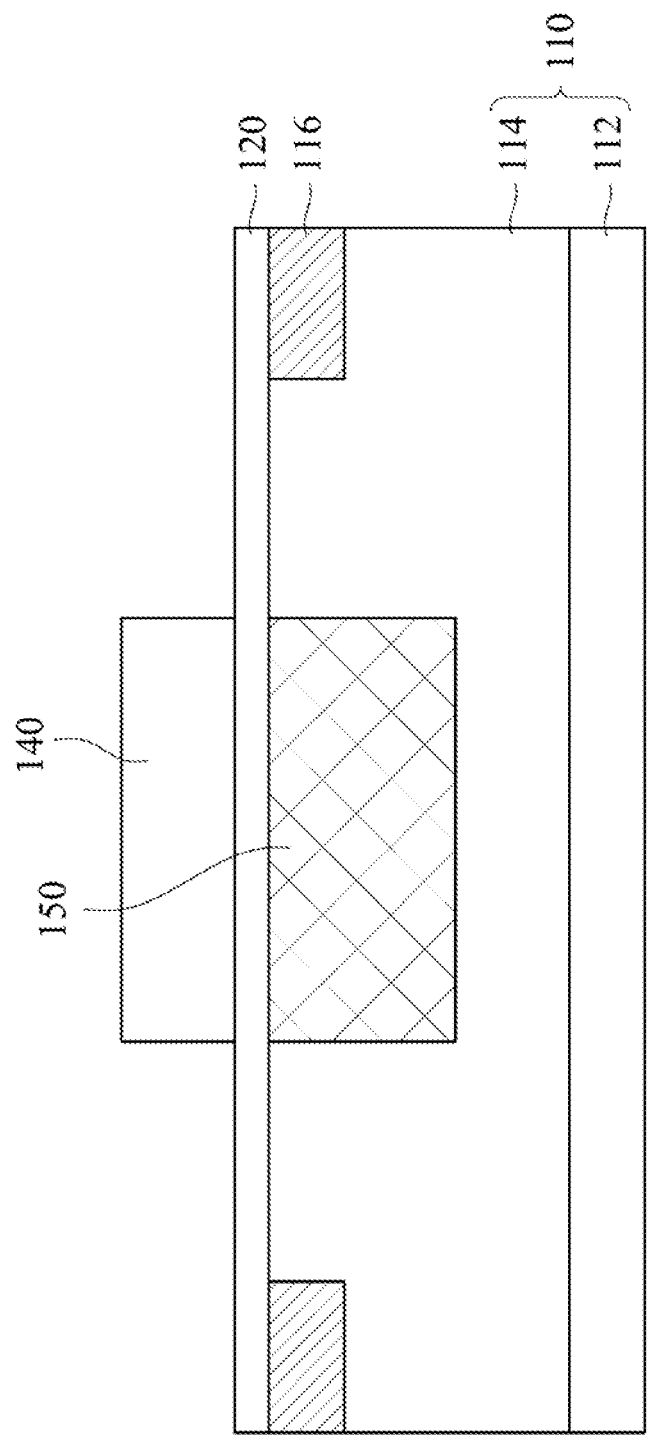

Reference is made to FIG. 2G. In step S37, a second etching process is performed to remove the first sacrificial layer 130. Specifically, the second etching process can be, for example, a wet or dry etching process. In detail, when the material of the first sacrificial layer 130 is silicon nitride, and the materials of the second sacrificial layer 140 and the protective layer 120 are silicon dioxide, the second etching process is a wet etching process; when the material of the layer 130 is polysilicon, and the materials of the second sacrificial layer 140 and the protective layer 120 are silicon dioxide, the second etching process is a dry etching process. In order to save the use of a mask and improve the convenience of the process, the third etching process is preferably a wet etching process, and in such an embodiment, the wet etchant can be hot phosphoric acid, and the etching temperature of the wet etching process can be between 160° C. and 180° C., at this etching temperature, the etching selectivity between the first sacrificial layer 130 and the second sacrificial layer 140 for hot phosphoric acid is between 8:1 and 9:1 to ensure that the first sacrificial layer 130 is completely removed, while the second sacrificial layer 140 and the protective layer 120 are still in their original place without being removed. After completing this step, a portion of the protective layer 120 is exposed due to the removal of the first sacrificial layer 130; and when the protective layer 120 is not provided in step S13, a portion of the substrate 110 (including the base region 116) is exposed due to the removal of the first sacrificial layer 130. After removing the first sacrificial layer 130, the vertical projection of the second sacrificial layer 140 on the substrate 110 completely overlaps the junction field effect transistor region 150.

Figure 2H:
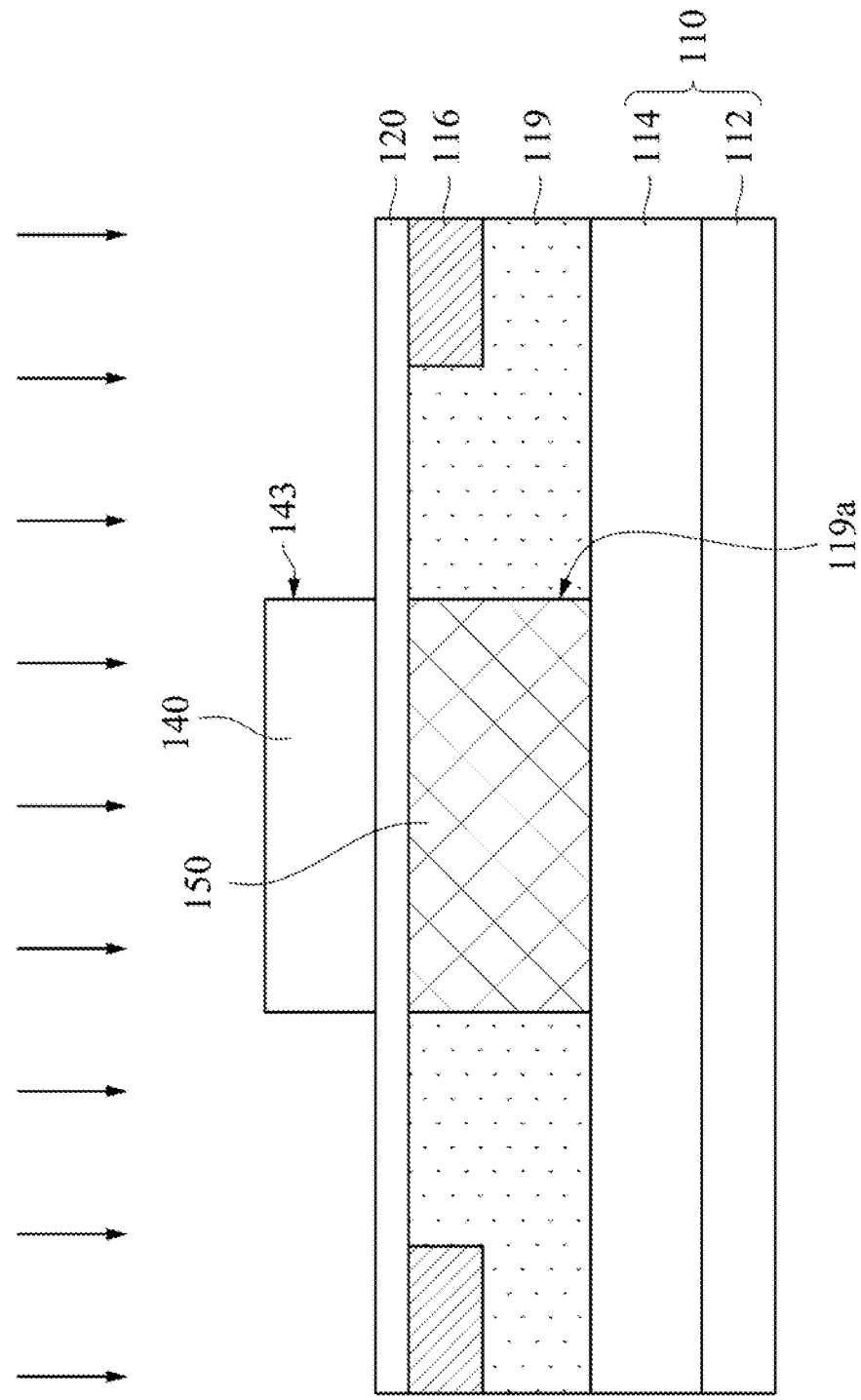

Reference is made to FIG. 2H. In step S38, a well region 119 is formed in the substrate 110 by using the second sacrificial layer 140 as a mask, in which the well region 119 is adjacent to the base region 116 and in contact with a bottom portion of the base region 116. In some embodiments, the well region 119 may be, for example, a P-type lightly doped region. Specifically, a P-type lightly doped implantation can be performed on the substrate 110 to form the well region 119 in the substrate 110. When both the protective layer 120 and the second sacrificial layer 140 are disposed on the substrate 110, dopants can penetrate through the protective layer 120 to be implanted into the substrate 110. The well region 119 is formed between the base region 116 and the vertical projection of the second sacrificial layer 140 on the substrate 110, and the inner side 119*a* of the well region 119 is substantially aligned with the outer sidewall 143 of the second sacrificial layer 140. When the protective layer 120 is not provided in step S33, the well region 119 can also be formed between the base region 116 and the vertical projection of the second sacrificial layer 140 on the substrate 110, and the inner side 119*a* of the well region 119 is substantially aligned with the outer sidewall 143 of the second sacrificial layer 140. In some embodiments, a hard mask layer can be formed on the base region 116 when the well region 119 is formed, such that the base region 116 is not affected when the well region 119 is formed. Alternatively, in FIG. 2B, the doping concentration of the base region 116 is decreased, such that when the well region 119 is formed, the ion concentration of the base region 116 can be increased to a desired concentration.

Figure 2I:
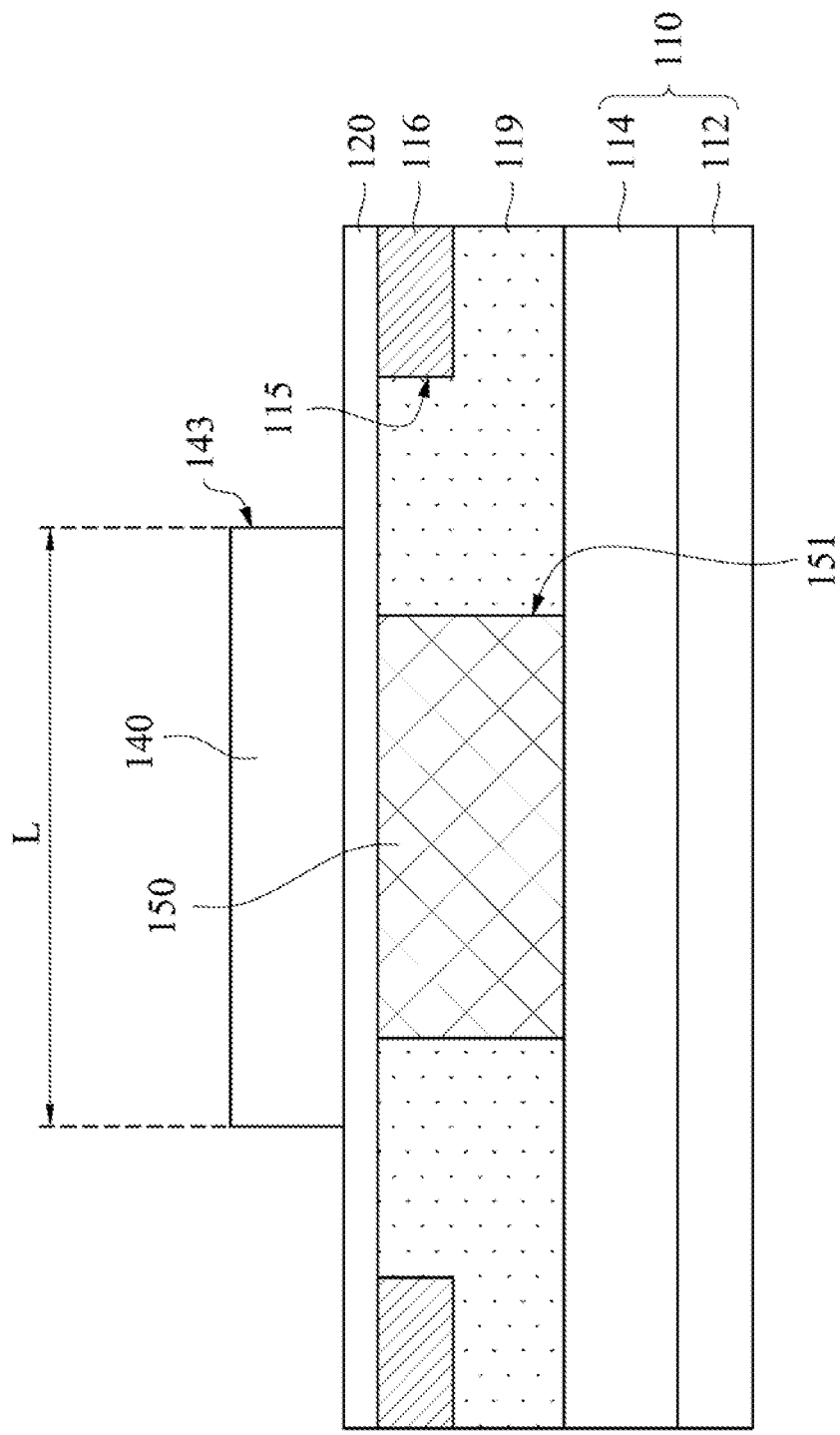

Reference is made to FIG. 2I. In step S39, the second sacrificial layer 140 is expanded, such that the outer sidewall 143 of the second sacrificial layer 140 is located on the substrate 110 at the outer side 151 of the junction field effect transistor region 150 and the inner side 115 of the base region 116. That is, there is a distance between the vertical projection of the outer sidewall 143 of the second sacrificial layer 140 on the substrate 110 and the outer side 151 of the junction field effect transistor region 150, and there is also a distance between the vertical projection of the outer sidewall 143 of the second sacrificial layer 140 on the substrate 110 and the inner side 115 of the base region 116, so as to define the boundary of the source region 118 to be formed later (see FIG. 2J). Specifically, a dielectric material may be deposited on the substrate 110 firstly, and after the dielectric material covers the second sacrificial layer 140, the excess dielectric material may be removed (shrunk), such that the second sacrificial layer 140, which act as a mask, is expanded (i.e., the length L1 of the mask is increased) due to the deposition of the dielectric material. In some embodiments, when the deposited dielectric material is the same as the material of the second sacrificial layer 140, an isotropic wet etching process may be performed to etch back (shrink) the dielectric material, thereby defining the position of the source region 118. In some embodiments, the etching-back length of the dielectric material can be precisely controlled by controlling the time of the wet etching process. Specifically, when performing the wet etching process, the time of the wet etching process is controlled according to the etching-back degree of the outer sidewall of the dielectric material. Since the etching rate of a wet etchant for a specific material is fixed (or calculable), the required etching time can be calculated based on the desired etching-back length. When both the dielectric material and the material of the second sacrificial layer 140 are silicon dioxide, the wet etchant may be hydrofluoric acid. In addition, when the protective layer 120 and the second sacrificial layer 140 are both disposed on the substrate 110, in order to prevent the protective layer 120 from being etched simultaneously, the material of the protective layer 120 can be different from the second sacrificial layer 140 (e.g., the material of the protective layer 120 can be silicon dioxide ($SiO_2$), silicon nitride (SiN), polysilicon). In some other embodiments, when the deposited dielectric material is polysilicon, the outer dielectric material can be removed due to oxidation by performing an oxidation process on the dielectric material, such that the position of the source region 118 is defined. After step S39 is completed, the outer sidewall 143 of the expanded second sacrificial layer 140 is the boundary position of the source region 118 to be formed later.

Figure 2J:
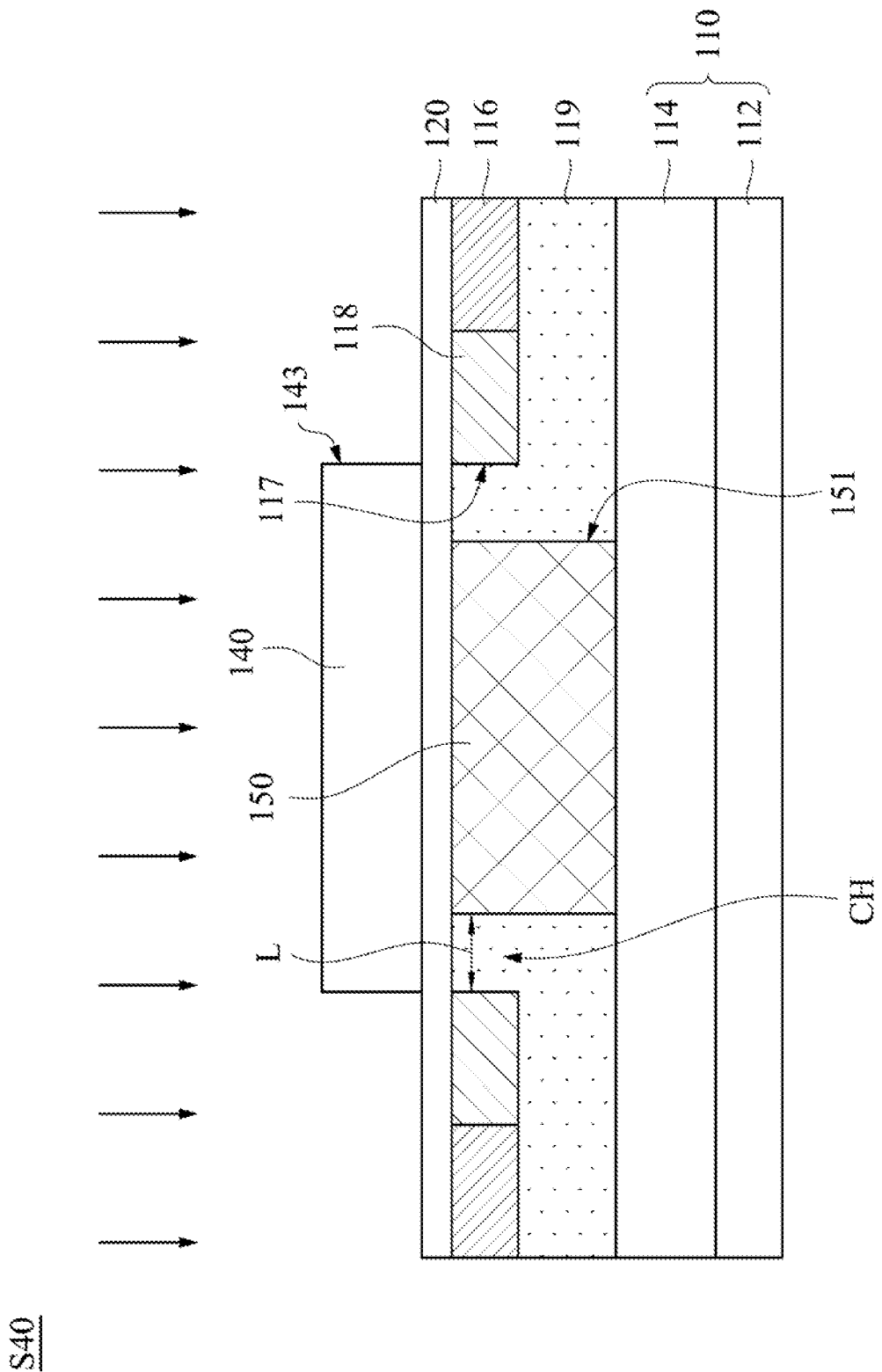

Reference is made to FIG. 2J. In step S40, the source region 118 is formed in the substrate 110 by using the second sacrificial layer 140 as a mask, in which the source region 118 is adjacent to and in contact with the base region 116, and the well region 119 is adjacent to the source region 118 and in contact with the bottom portion of the base region 116 and the bottom portion of source region 118. In some embodiments, the source region 118 is an N-type heavily doped region. Specifically, an N-type heavily doped implantation can be performed on the substrate 110 to form the source region 118 in the substrate 110. When both the protective layer 120 and the second sacrificial layer 140 are disposed on the substrate 110, dopants can penetrate through the protective layer 120 to be implanted into the substrate 110. The source region 118 is formed between the base region 116 and the vertical projection of the second sacrificial layer 140 on the substrate 110, in which the inner side 117 of the source region 118 is substantially aligned with the outer sidewall 143 of the second sacrificial layer 140, and a distance is between the outer side 151 of the junction field effect transistor region 150. When the protective layer 120 is not provided in step S33, the source region 118 can also be formed between the base region 116 and the vertical projection of the second sacrificial layer 140 on the substrate 110, and the inner side 117 of the source region 118 is substantially aligned with the outer sidewall 143 of the second sacrificial layer 140. In some embodiments, the doping concentration of the source region 118 is higher than the doping concentration of the epitaxial layer 114. In some embodiments, a hard mask layer can be formed on the base region 116 when the source region 118 is formed, such that the base region 116 is not affected when the source region 118 is formed. Alternatively, in FIG. 2B, the doping concentration of the base region 116 is increased, such that when the source region 118 is formed, the ion concentration of the base region 116 can be adjusted to a desired concentration. After the source region 118 is formed, the channel region CH extending from the inner side 117 of the source region 118 to the outer side 151 of the junction field effect transistor region 150 is obtained, and the length L of the channel region CH is 200 nm to 2000 nm.

Overall, in this embodiment, the base region 116, the junction field effect transistor region 150, the well region 119, and the source region 118 are sequentially formed. Specifically, the covering area of the first sacrificial layer 130 is precisely defined through a single photolithography and etching process such that the position of the ion-doped region (junction field effect transistor region 150) is defined, then the covering area of the second sacrificial layer 140 is defined through the first sacrificial layer 130, then the position of another ion-doped region (well region 119) is precisely defined by using the second sacrificial layer 140 as a mask, and then the position of another ion-doped region (source region 118) is defined by expanding the second sacrificial layer 140. In this way, the length L of the channel region CH extending between the source region 118 and the junction field effect transistor region 150 can be controlled at the limit value of the device (i.e., the shortest acceptable length L of the channel region CH). Therefore, the impedance contributed by the channel region CH is reduced, thereby reducing the overall impedance of the semiconductor element. In addition, if the length L of the channel region CH is the shortest acceptable length, the size of the semiconductor device can be reduced accordingly. Similarly, in this embodiment, three ion-doped regions can be formed by only a single photolithography process (step S34, FIG. 2D), which saves mask costs and reduces costs.

Figure 2K:
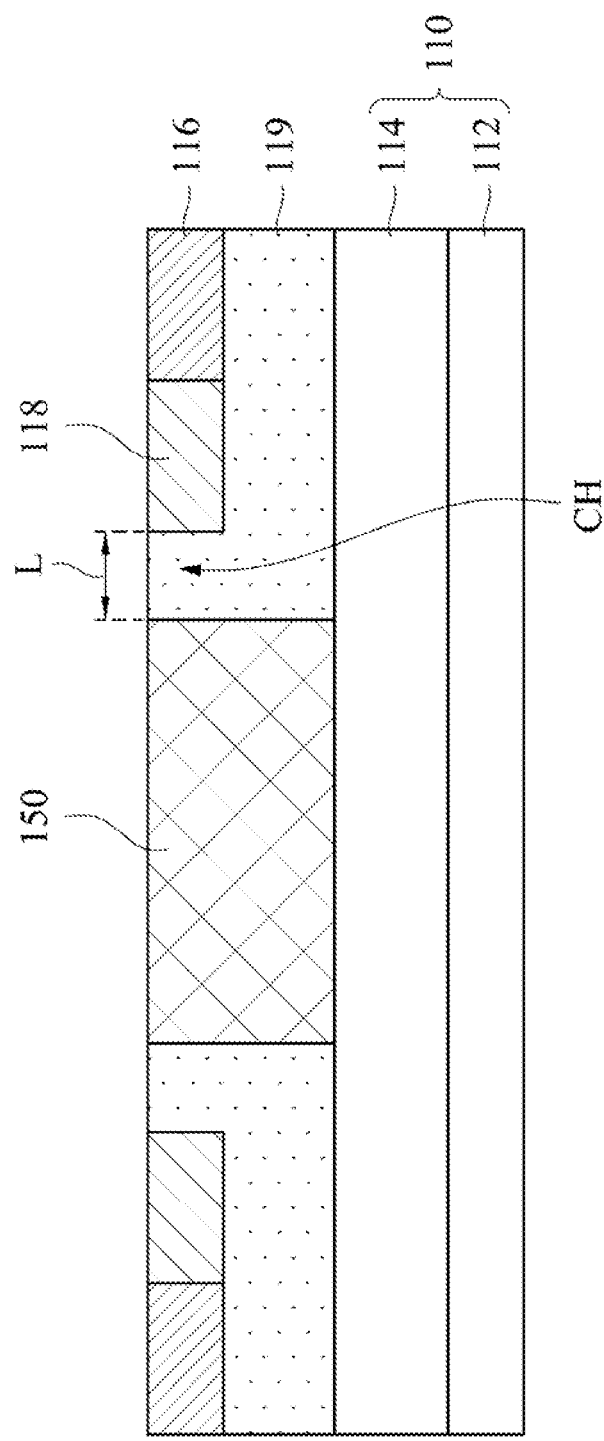

Reference is made to FIG. 2K. In step S41, the second sacrificial layer 140 and the protective layer 120 are removed to expose the substrate 110 and the base region 116, the source region 118, the well region 119, and the junction field effect transistor region 150 in the substrate 110. In some embodiments, the second sacrificial layer 140 and the protective layer 120 can be removed simultaneously by dry etching, wet etching, or a combination thereof. In some embodiments, when the second sacrificial layer 140 and the protective layer 120 are silicon dioxide, the wet etchant may be hydrofluoric acid. After removing the second sacrificial layer 140 and the protective layer 120, an annealing process may be performed on the base region 116, the source region 118, the well region 119, and the junction field effect transistor region 150 to repair the lattice defects of the doped regions (the base region 116, the source region 118, the well region 119, and the junction field effect transistor region 150) of the substrate 110, and make the dopants diffuse to the lattice replacement position of the substrate 110, such that the dopants is activated to be the dopant atoms with semiconducting electrical properties. It should be understood that when the protective layer 120 is not provided in step S33, only the second sacrificial layer 140 is removed in this step to expose the substrate 110 and the base region 116, the source region 118, and the well region 119 in the substrate.

The following steps S42 to S44 are the same as the steps S21 to S23 in the aforementioned FIGS. 1K to 1M. For details, please refer to the previous description, which will not be repeated hereinafter. After completing the above steps, the resulting semiconductor device can be as shown in FIG. 1M.

In summary, some embodiments of the present disclosure can be used to reduce the impedance of semiconductor devices (e.g., transistors). Specifically, the limit value of the channel length of the semiconductor device can be precisely defined through at least one sacrificial layer and the time control of the wet etching process, thereby reducing the impedance of the semiconductor device and reducing the size of the semiconductor device. In addition, the position of the three ion-doped regions can be precisely defined through only a single photolithography process, which can also save the cost of the mask and reduce the cost. In addition, according to the process requirements, the source region, the well region, and the junction field effect transistor region can be sequentially formed, or the junction field effect transistor region, the well region, and the source region can be sequentially formed, providing flexibility in manufacturing process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A manufacturing method of a semiconductor device, comprising:
   forming a base region in a substrate;
   forming a first sacrificial layer on the substrate, wherein the first sacrificial layer covers the base region;
   performing a photolithography process and a first etching process to pattern the first sacrificial layer, thereby forming a first distance between a vertical projection of an outer sidewall of the first sacrificial layer on the substrate and an inner side of the base region;
   forming a source region in the substrate by using the first sacrificial layer as a mask, wherein the source region is adjacent to the base region;
   performing a second etching process to etch back the first sacrificial layer, thereby forming a second distance between the vertical projection of the outer sidewall of the first sacrificial layer on the substrate and an inner side of the source region;
   forming a well region in the substrate by using the first sacrificial layer as a mask, wherein the well region is adjacent to the source region, and the well region is in contact with a bottom portion of the base region and a bottom portion of the source region;
   forming a second sacrificial layer on the substrate, wherein the second sacrificial layer covers the base region, the source region, and the well region;
   performing a third etching process to remove the first sacrificial layer;
   forming a junction field effect transistor region in the substrate by using the second sacrificial layer as a mask; and
   removing the second sacrificial layer.

2. The manufacturing method of the semiconductor device of claim 1, wherein the first etching process, the second etching process, and the third etching process are wet etching processes.

3. The manufacturing method of the semiconductor device of claim 1, wherein during the second etching process, the degree of etching-back of the first sacrificial layer is controlled by a time of the second etching process.

4. The manufacturing method of the semiconductor device of claim 1, wherein the third etching process is a wet etching process, and at the etching temperature of the third etching process, an etching selectivity between the first sacrificial layer and the second sacrificial layer for an etchant is between 8:1 and 9:1.

5. The manufacturing method of the semiconductor device of claim 1, wherein a material of the first sacrificial layer comprises silicon nitride, a material of the second sacrificial layer comprises silicon dioxide, and the third etching process is a wet etching process.

6. The manufacturing method of the semiconductor device of claim 1, wherein a material of the first sacrificial layer comprises polysilicon, a material of the second sacrificial layer comprises silicon dioxide, and the third etching process is a dry etching process.

7. A manufacturing method of a semiconductor device, comprising:
   forming a base region in a substrate;
   forming a first sacrificial layer on the substrate, wherein the first sacrificial layer covers the base region;
   performing a photolithography process and a first etching process to pattern the first sacrificial layer, thereby forming a first distance between a vertical projection of an inner sidewall of the first sacrificial layer on the substrate and an inner side of the base region;
   forming a junction field effect transistor region in the substrate by using the first sacrificial layer as a mask;
   forming a second sacrificial layer on the substrate, wherein the second sacrificial layer covers the junction field effect transistor region;
   performing a second etching process to remove the first sacrificial layer;
   forming a well region in the substrate by using the second sacrificial layer as a mask, wherein the well region is adjacent to the base region, and the well region is in contact with a bottom portion of the base region;
   expanding the second sacrificial layer, thereby forming a second distance between a vertical projection of an outer sidewall of the second sacrificial layer on the substrate and an outer side of the junction field effect transistor region;
   forming a source region in the substrate by using the second sacrificial layer as a mask, wherein the well region is adjacent to the source region, and the well region is in contact with the bottom portion of the base region and a bottom portion of the source region; and
   removing the second sacrificial layer.

8. The manufacturing method of the semiconductor device of claim 7, wherein the base region is a P-type heavily doped region, the junction field effect transistor region and the source region are N-type heavily doped regions, and the well region is a P-type lightly doped region.

9. The manufacturing method of the semiconductor device of claim 7, wherein expanding the second sacrificial layer comprises:
depositing a dielectric material on the substrate to cover the second sacrificial layer, wherein the dielectric material and a material of the second sacrificial layer are the same; and
performing an isotropic etching process to etch back the dielectric material, thereby defining a position of the source region.

10. The manufacturing method of the semiconductor device of claim 7, wherein expanding the second sacrificial layer comprises:
depositing a dielectric material on the substrate to cover the second sacrificial layer, wherein the dielectric material comprises polysilicon; and
performing an oxidation process to etch back the dielectric material, thereby defining a position of the source region.

11. The manufacturing method of the semiconductor device of claim 7, further comprising:
forming a dielectric layer on the substrate; and
forming a conductive layer on the dielectric layer.

12. The manufacturing method of the semiconductor device of claim 11, further comprising:
patterning the dielectric layer and the conductive layer to form a gate dielectric layer and a gate layer on the substrate, wherein the gate dielectric layer is in contact with the source region.

13. A manufacturing method of a semiconductor device, comprising:
forming base region in a substrate;
forming a protective layer on the substrate, wherein the protective layer covers the base region;
forming a first sacrificial layer and a second sacrificial layer on the substrate, wherein the first sacrificial layer and the second sacrificial layer covers the protective layer;
forming a source region, a well region, and a junction field effect transistor in the substrate, wherein:
the source region, the well region, and the junction field effect transistor region are formed in sequence, the source region and the well region are formed by the first sacrificial layer that is patterned, and the junction field effect transistor region is formed by the second sacrificial layer; or
the junction field effect transistor region, the well region, and the source region are formed in sequence, the junction field effect transistor region is formed by the first sacrificial layer that is patterned, and the well region and the source region are formed by the second sacrificial layer.

14. The manufacturing method of the semiconductor device of claim 13, wherein after removing the first sacrificial layer and the second sacrificial layer, an annealing process is performed on the base region, the source region, the well region, and the junction field effect transistor region.

15. The manufacturing method of the semiconductor device of claim 13, wherein a material of the protective layer is different from a material of the first sacrificial layer.

16. The manufacturing method of the semiconductor device of claim 13, wherein a material of the protective layer is the same as a material of the second sacrificial layer.

17. The manufacturing method of the semiconductor device of claim 13, wherein when forming the source region or the well region, a dopant penetrates through the protective layer to be implanted into the substrate.

18. The manufacturing method of the semiconductor device of claim 13, wherein when forming the junction field effect transistor region, a dopant penetrates through the protective layer to be implanted into the substrate.

19. The manufacturing method of the semiconductor device of claim 13, wherein when a temperature is between 160° C. and 180° C., an etching selectivity between the first sacrificial layer and the protective layer for an etchant is between 8:1 and 9:1.

20. The manufacturing method of the semiconductor device of claim 13, further comprising:
removing the protective layer and the second sacrificial layer at the same time.

* * * * *

UNITED STATES PATENT AND TRADEMARK OFFICE
CERTIFICATE OF CORRECTION

| | | |
|---|---|---|
| PATENT NO. | : 12,490,450 B2 | Page 1 of 1 |
| APPLICATION NO. | : 18/360843 | |
| DATED | : December 2, 2025 | |
| INVENTOR(S) | : Yi-Kai Hsiao, Kuang-Hao Chiang and Hao-Chung Kuo | |

It is certified that error appears in the above-identified patent and that said Letters Patent is hereby corrected as shown below:

On the Title Page

Item (73) the name of the first Assignee should read as:
"HON HAI PRECISION INDUSTRY CO., LTD."

Signed and Sealed this
Twenty-seventh Day of January, 2026

John A. Squires
*Director of the United States Patent and Trademark Office*